(12) United States Patent
Ono

(10) Patent No.: US 12,191,326 B2
(45) Date of Patent: *Jan. 7, 2025

(54) SOLID-STATE IMAGING DEVICE

(71) Applicant: SONY SEMICONDUCTOR SOLUTIONS CORPORATION, Kanagawa (JP)

(72) Inventor: Toshiaki Ono, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/377,671

(22) Filed: Oct. 6, 2023

(65) Prior Publication Data

US 2024/0038788 A1    Feb. 1, 2024

Related U.S. Application Data

(63) Continuation of application No. 17/261,061, filed as application No. PCT/JP2019/027161 on Jul. 9, 2019.

(30) Foreign Application Priority Data

Jul. 31, 2018    (JP) .................................. 2018-144065

(51) Int. Cl.
*H01L 27/146*        (2006.01)
*B60R 1/00*          (2022.01)
(Continued)

(52) U.S. Cl.
CPC ........ *H01L 27/14605* (2013.01); *B60R 1/001* (2013.01); *G02B 23/2407* (2013.01);
(Continued)

(58) Field of Classification Search
None
See application file for complete search history.

(56) References Cited

U.S. PATENT DOCUMENTS

2007/0279501 A1    12/2007    Takashi
2007/0285538 A1    12/2007    Suzuki
(Continued)

FOREIGN PATENT DOCUMENTS

CN          102891153          1/2013
JP          2007-311550        11/2007
(Continued)

OTHER PUBLICATIONS

Building equipment control system, Aug. 31, 2007, Edited by Gong Xuemei Beijing: China Electric Power Press, pp. 42-50.
(Continued)

*Primary Examiner* — Alexander G Ghyka
(74) *Attorney, Agent, or Firm* — SHERIDAN ROSS P.C.

(57) ABSTRACT

A solid-state imaging device according to an embodiment of the present disclosure includes a stacked photoelectric converter for each of pixels. The stacked photoelectric converter has a plurality of photoelectric conversion elements stacked therein. The plurality of photoelectric conversion elements each has different wavelength selectivity. This solid-state imaging device further includes a plurality of data output lines from which pixel signals based on electric charges outputted from the photoelectric conversion elements are outputted. A plurality of data output lines is provided for each predetermined unit pixel column. The plurality of the data output lines is equal in number to an integer multiple of the photoelectric conversion elements stacked in the stacked photoelectric converter.

6 Claims, 35 Drawing Sheets

(51) Int. Cl.
  *G02B 23/24* (2006.01)
  *H04N 23/50* (2023.01)
  *H04N 25/766* (2023.01)
(52) U.S. Cl.
  CPC ..... *H01L 27/14621* (2013.01); *H04N 25/766* (2023.01); *H04N 23/555* (2023.01)

(56) References Cited

U.S. PATENT DOCUMENTS

| | | | |
|---|---|---|---|
| 2007/0291144 | A1 | 12/2007 | Suzuki |
| 2011/0176045 | A1 | 7/2011 | Chak |
| 2015/0264286 | A1 | 9/2015 | Yamaoka |
| 2018/0091754 | A1 | 3/2018 | Okura |
| 2018/0191981 | A1 | 7/2018 | Masanori |
| 2021/0296382 | A1 * | 9/2021 | Ono ................... H10K 39/32 |

FOREIGN PATENT DOCUMENTS

| | | |
|---|---|---|
| JP | 2010-153658 | 7/2010 |
| JP | 2011-151800 | 8/2011 |
| JP | 2012-124197 | 6/2012 |
| JP | 2012-160619 | 8/2012 |
| JP | 2013055500 A | 3/2013 |
| JP | 2013070249 A | 4/2013 |
| JP | 2014-204149 | 10/2014 |
| JP | 2015-177311 | 10/2015 |
| JP | 2016033981 A | 3/2016 |
| JP | 2018098524 A | 6/2018 |
| JP | 2018-110353 | 7/2018 |
| KR | 20070112066 A | 11/2007 |
| KR | 20110011542 A | 2/2011 |
| WO | WO 2016/121521 | 8/2016 |
| WO | WO 2017/126319 | 7/2017 |

OTHER PUBLICATIONS

International Search Report and Written Opinion for International (PCT) Patent Application No. PCT/JP2019/027161.
English Translation of the Decision to Grant for Japan Patent Application No. 2020-534141, dated Apr. 18, 2023, 2 pages.
Official Action for U.S. Appl. No. 17/261,061, dated Sep. 21, 2023 9 pages.

* cited by examiner

FIG. 7

| VSL1 | B | B | R | R | B | B | G | G | R | R |   |   |   |   | G | G |   |   |
|------|---|---|---|---|---|---|---|---|---|---|---|---|---|---|---|---|---|---|
| VSL2 |   |   |   |   |   |   | G | G |   |   | B | B | R | R | B | B | G | G | R | R |

FIG. 11

|      |   |   |   |   |
|------|---|---|---|---|
| VSL1 | G | G | G | G |
| VSL2 | B | B | B | B |
| VSL3 | R | R | R | R |

FIG. 13

|      |   |   |   |   |
|------|---|---|---|---|
| VSL1 | G | G | G | G |
| VSL2 | B | B | B | B |
| VSL3 | R | R | R | R |
| VSL4 | G | G | G | G |
| VSL5 | B | B | B | B |
| VSL6 | R | R | R | R |

FIG. 20

| VSL1 | G1 | G2 |
|------|----|----|
| VSL2 | B  | R  |

FIG. 23

| | | | | |
|---|---|---|---|---|
| | \multicolumn{4}{c}{PHASE DIFFERENCE DETECTION MODE} |
| VSL1 | G1 | G2 | G1 | G2 |
| VSL2 | B | | B | |
| VSL3 | | R | | R |

FIG. 24

| | | |
|---|---|---|
| | \multicolumn{2}{c}{HIGH-SPEED READOUT MODE} |
| VSL1 | G1 | G2 |
| VSL2 | B | B |
| VSL3 | R | R |

FIG. 30

| VSL1 | G | G | G | G |
|------|---|---|---|---|
| VSL2 | B | R | B | R |

| VSL1 | G | G |
| VSL2 | B | B |
| VSL3 | G | G |
| VSL4 | R | R |

SOLID-STATE IMAGING DEVICE

CROSS REFERENCE TO RELATED APPLICATIONS

This application is a continuation application of U.S. patent application Ser. No. 17/261,061, filed Jan. 18, 2021, which is a national stage application under 35 U.S.C. 371 and claims the benefit of PCT Application No. PCT/JP2019/027161 having an international filing date of Jul. 9, 2019, which designated the United States, which PCT application claimed the benefit of Japanese Patent Application No. 2018-144065, filed Jul. 31, 2018, the entire disclosures of each of which are incorporated herein by reference.

TECHNICAL FIELD

The present disclosure relates to a solid-state imaging device.

BACKGROUND ART

Photoelectric conversion elements each including a material such as an organic semiconductor material having wavelength selectivity are each able to photoelectrically convert light in a specific wavelength band. In a case where such photoelectric conversion elements are used for a solid-state imaging device, it is possible to provide a stacked photoelectric converter for each of pixels (see PTL 1). In the stacked photoelectric converter, a plurality of photoelectric conversion elements each having different wavelength selectivity is stacked.

CITATION LIST

Patent Literature

PTL 1: International Publication No. WO 2016/121521

SUMMARY OF THE INVENTION

Incidentally, there is still room to further optimize the coupling between a pixel and a data output line or a drive wiring line in the field of the above-described solid-state imaging device. It is thus desirable to provide a solid-state imaging device having a pixel and a data output line or a drive wiring line appropriately coupled.

A solid-state imaging device according to a first embodiment of the present disclosure includes a stacked photoelectric converter for each of pixels. The stacked photoelectric converter has a plurality of photoelectric conversion elements stacked therein. The plurality of photoelectric conversion elements each has different wavelength selectivity. This solid-state imaging device further includes a plurality of data output lines from which pixel signals based on electric charges outputted from the photoelectric conversion elements are outputted. A plurality of data output lines is provided for each predetermined unit pixel column. The plurality of the data output lines is equal in number to an integer multiple of the photoelectric conversion elements stacked in the stacked photoelectric converter.

The solid-state imaging device according to the first embodiment of the present disclosure is provided with a plurality of data output lines for each predetermined unit pixel column. The plurality of the data output lines is equal in number to an integer multiple of the photoelectric conversion elements stacked in the stacked photoelectric converter. This allows data to be read out at higher speed than in a case where one data output line is provided for each predetermined unit pixel column. It is thus possible to achieve high-speed data readout by including more data output lines.

A solid-state imaging device according to a second embodiment of the present disclosure includes a stacked photoelectric converter for each of pixels. The stacked photoelectric converter has a plurality of photoelectric conversion elements stacked therein. The plurality of photoelectric conversion elements each has different wavelength selectivity. This solid-state imaging device includes a first pixel circuit for each of groups. The first pixel circuit outputs a pixel signal based on an electric charge outputted from a first photoelectric conversion element of a plurality of the photoelectric conversion elements. The first photoelectric conversion element has predetermined wavelength selectivity. The groups are obtained by dividing a plurality of the first photoelectric conversion elements into the plurality of groups. The plurality of the first photoelectric conversion elements is included in a plurality of the photoelectric conversion elements. This solid-state imaging device further includes a plurality of drive wiring lines to which control signals are applied. The control signals for controlling output of electric charges accumulated in the photoelectric conversion elements. In a case where a plurality of the first photoelectric conversion elements belonging to a first group and a plurality of the first photoelectric conversion elements belonging to a second group are brought into focus, each of the drive wiring lines is coupled to the first photoelectric conversion elements belonging to the first group and the first photoelectric conversion elements belonging to the second group in each of unit pixel columns corresponding to the shared first pixel circuits. The plurality of the first photoelectric conversion elements belonging to the first group and the plurality of the first photoelectric conversion elements belonging to the second group share the different first pixel circuits.

The solid-state imaging device according to the second embodiment of the present disclosure couples the respective drive wiring lines to the first photoelectric conversion elements belonging to the first group and the first photoelectric conversion elements belonging to the second group in each of unit pixel columns. This makes it possible to decrease the number of drive wiring lines as compared with a case where a drive wiring line is provided for each of the photoelectric conversion elements. Here, the drive wiring lines sometimes block light incident on the photoelectric conversion element provided in the lower portion of the stacked photoelectric converter. This makes it possible to increase an aperture ratio by including less drive wiring lines.

A solid-state imaging device according to a third embodiment of the present disclosure includes a stacked photoelectric converter for each of pixels. The stacked photoelectric converter has a plurality of photoelectric conversion elements stacked therein. The plurality of photoelectric conversion elements each has different wavelength selectivity. This solid-state imaging device includes a first pixel circuit for each of first photoelectric conversion elements of a plurality of the photoelectric conversion elements. The first pixel circuit outputs a pixel signal based on an electric charge outputted from the first photoelectric conversion element. The first photoelectric conversion elements have predetermined wavelength selectivity. This solid-state imaging device further includes a second pixel circuit for each of groups. The second pixel circuit outputs a pixel signal based on an electric charge outputted from a second photoelectric conversion element of a plurality of the photoelectric conversion elements other than the first photoelectric conversion element. The first photoelectric conversion element has predetermined wavelength selectivity. The groups are obtained by dividing a plurality of the second photoelectric conversion elements into the plurality of groups. The plurality of the second photoelectric conversion elements is included in a plurality of the photoelectric conversion elements. This solid-state imaging device further includes two data output lines from which the pixel signals are outputted for each of the unit pixel columns. One of the data output lines is coupled to each of the first pixel circuits and another of the data output lines is coupled to each of the second pixel circuits in each of the pixel columns. Each of the first photoelectric conversion elements includes two photoelectric conversion sections.

The solid-state imaging device according to the third embodiment of the present disclosure is provided with the two data output lines for each of the pixel columns. One of the data output lines is coupled to each of the first pixel circuits and the other data output line is coupled to each of the second pixel circuits in each of the pixel columns. Further, in this solid-state imaging device, each of the first photoelectric conversion elements includes two photoelectric conversion sections. This makes it possible to read out, for example, while reading out pieces of data from the two photoelectric conversion sections, data from another photoelectric conversion element. As a result, there is no need to separately make time to obtain phase difference data for autofocus. It is thus possible to achieve higher data readout efficiency than in a case where time is separately made to obtain phase difference data for autofocus.

BRIEF DESCRIPTION OF DRAWING

FIG. 7 is a diagram illustrating an example of data output in the solid-state imaging device having the circuit configuration in FIG. 6.

FIG. 11 is a diagram illustrating an example of data output in the solid-state imaging device having the circuit configuration in FIG. 10.

FIG. 13 is a diagram illustrating an example of data output in the solid-state imaging device having the circuit configuration in FIG. 12.

FIG. 20 is a diagram illustrating an example of data output in the solid-state imaging device having the circuit configuration in FIG. 19.

FIG. 23 is a diagram illustrating an example of data output in each of the solid-state imaging devices having the circuit configurations in FIGS. 21 and 22.

FIG. 24 is a diagram illustrating an example of data output in the solid-state imaging device having the circuit configuration in FIG. 23.

FIG. 30 is a diagram illustrating a modification example of the cross-sectional configuration of the pixel in FIG. 1.

MODES FOR CARRYING OUT THE INVENTION

Figure 2:
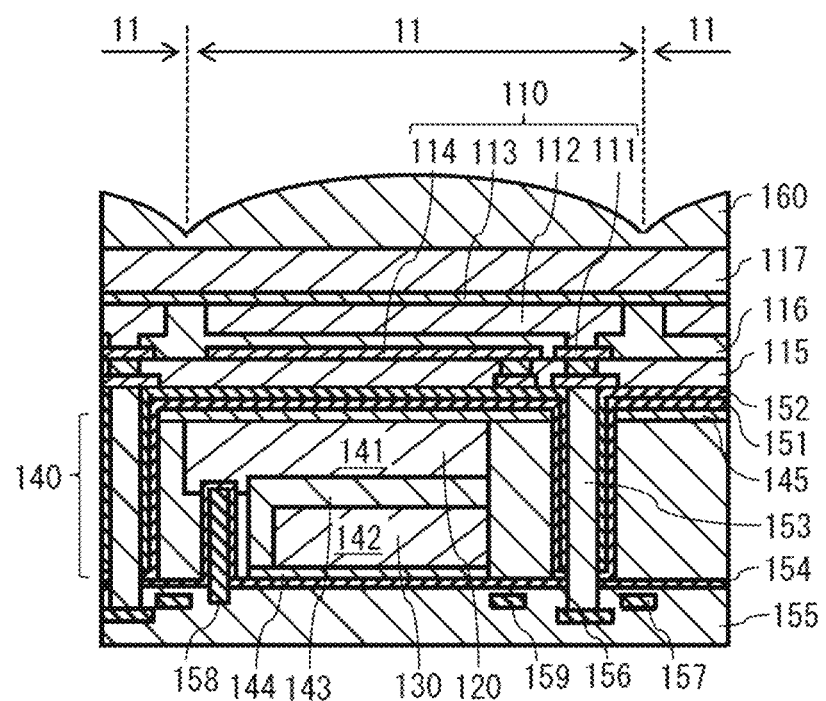
FIG. 2 is a diagram illustrating an example of a cross-sectional configuration of a pixel in FIG. 1.
Figure 3:
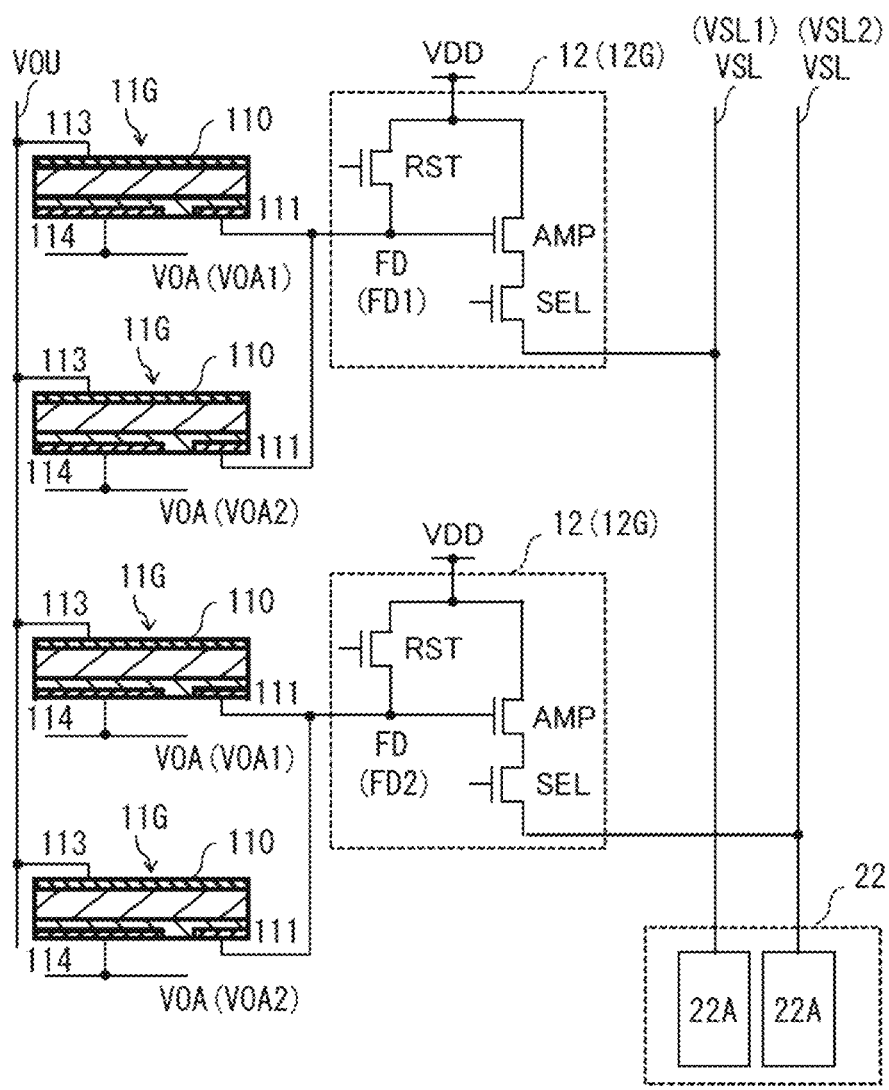
FIG. 3 is a diagram illustrating an example of a circuit configuration of the pixel and a component therearound in FIG. 1.
Figure 5:
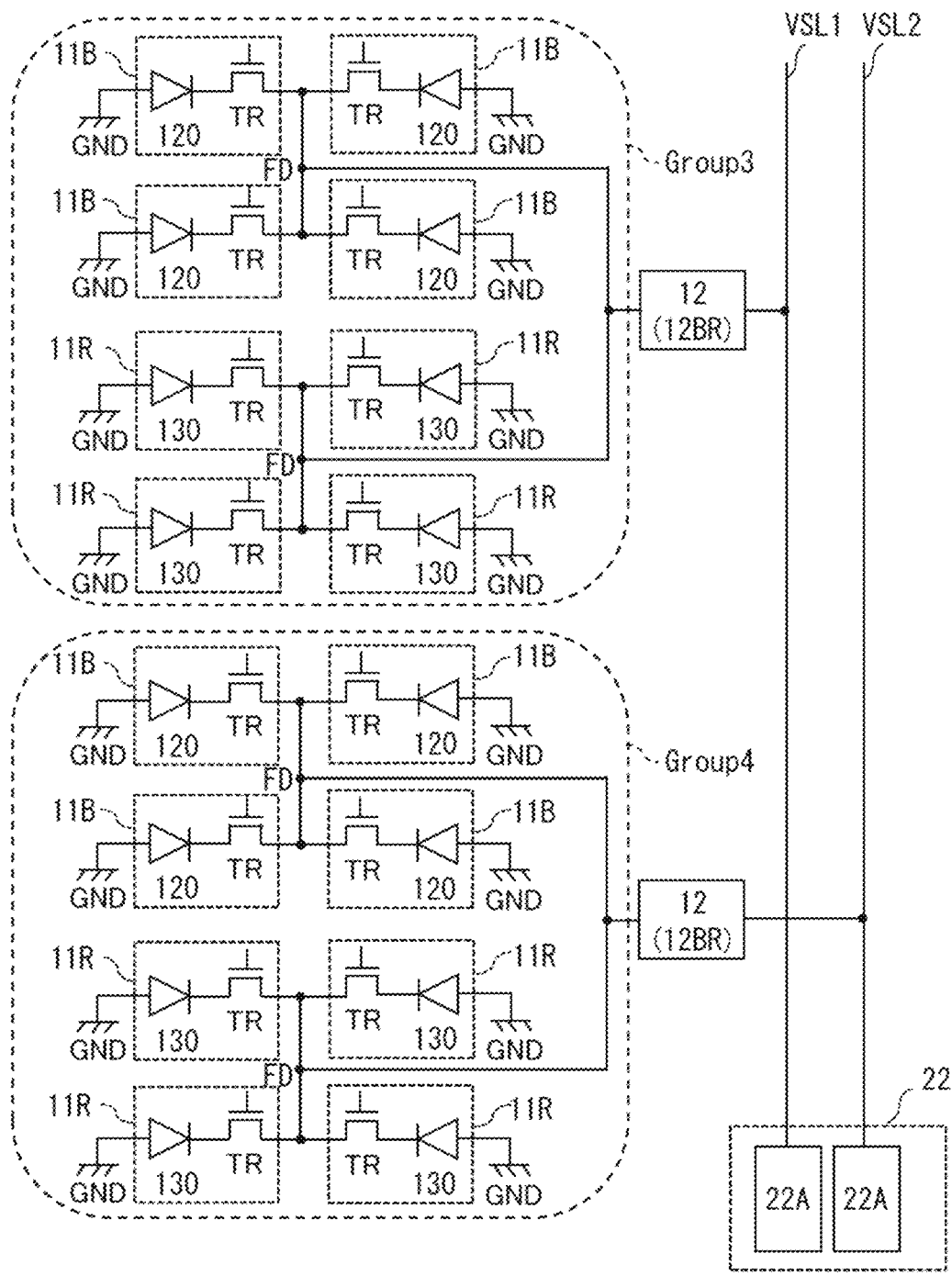
FIG. 5 is a diagram illustrating an example of the circuit configuration of the pixel and the component therearound in FIG. 1.
Figure 6:
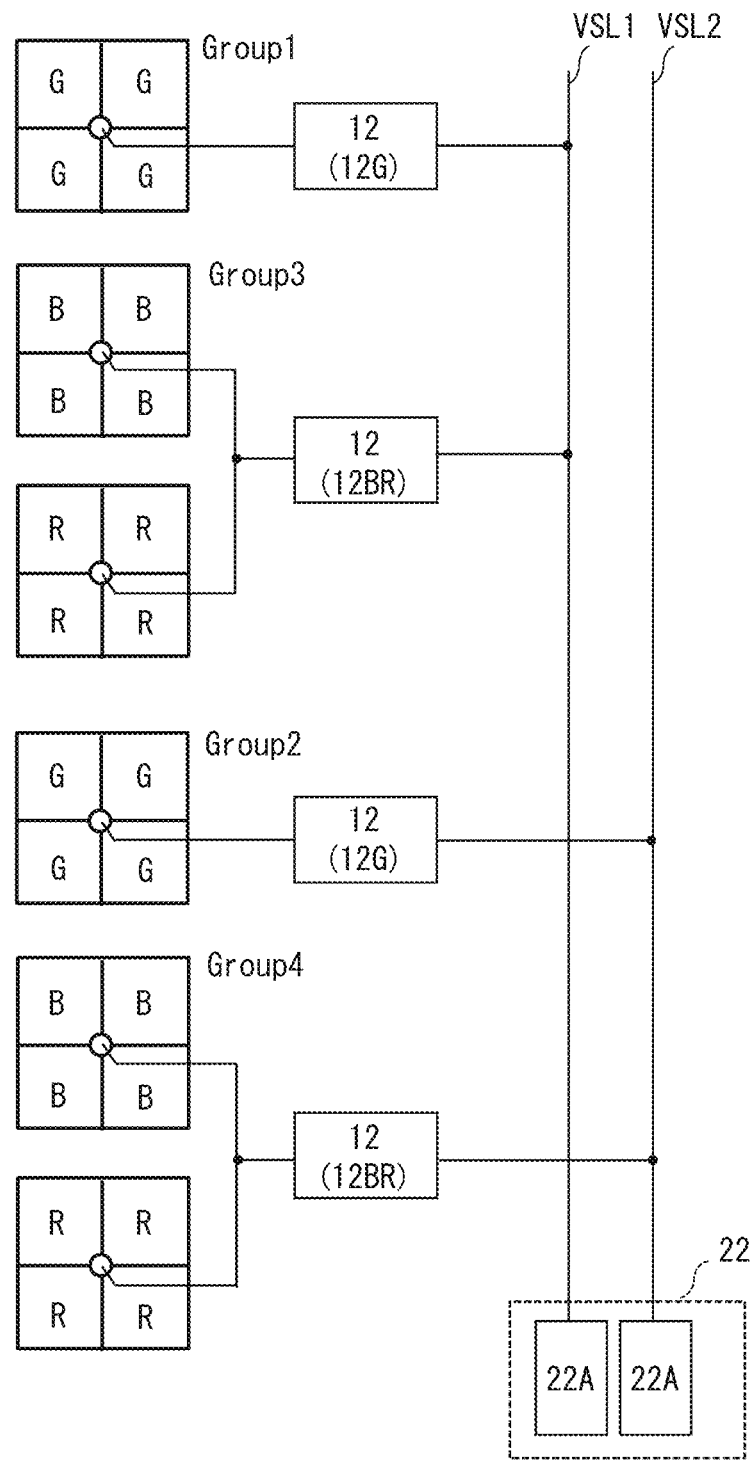
FIG. 6 is a diagram in which the circuit configurations illustrated in FIGS. 3 to 5 are simplified.
Figure 25:
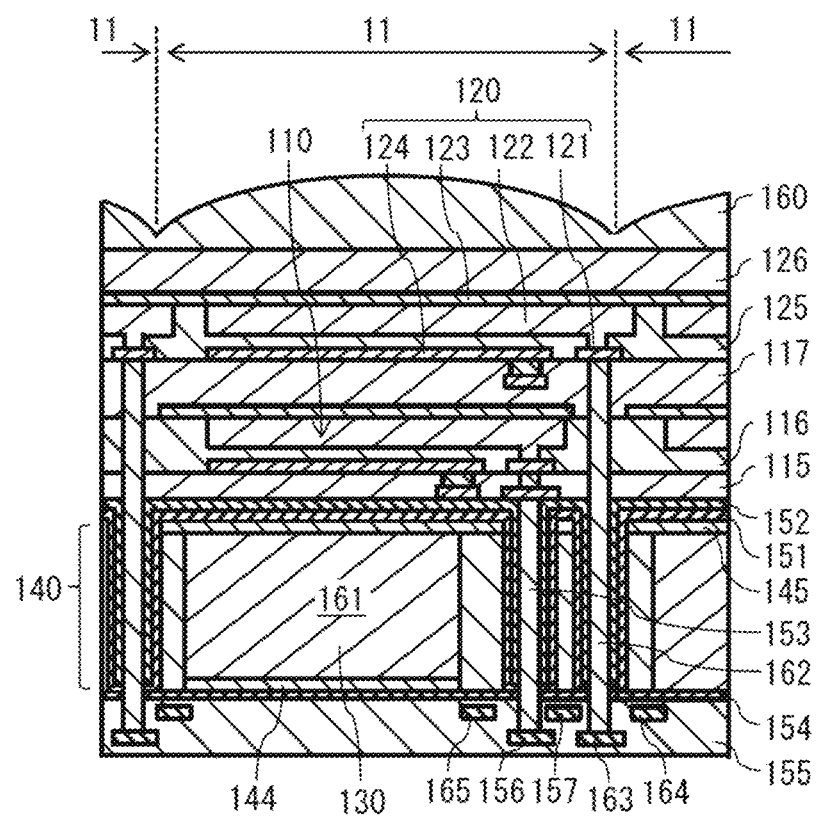
FIG. 25 is a diagram illustrating an example of a schematic configuration of a solid-state imaging device according to a second embodiment of the present disclosure.
Figure 26:
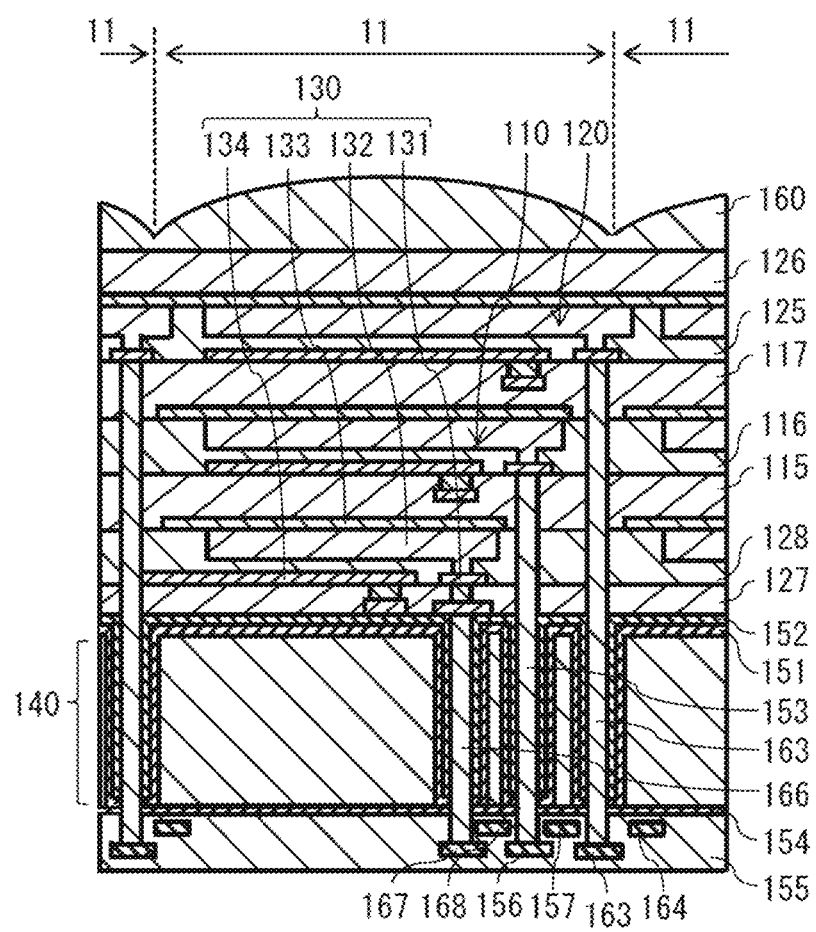
FIG. 26 is a diagram illustrating an example of a cross-sectional configuration of a pixel in FIG. 25.
Figure 36:
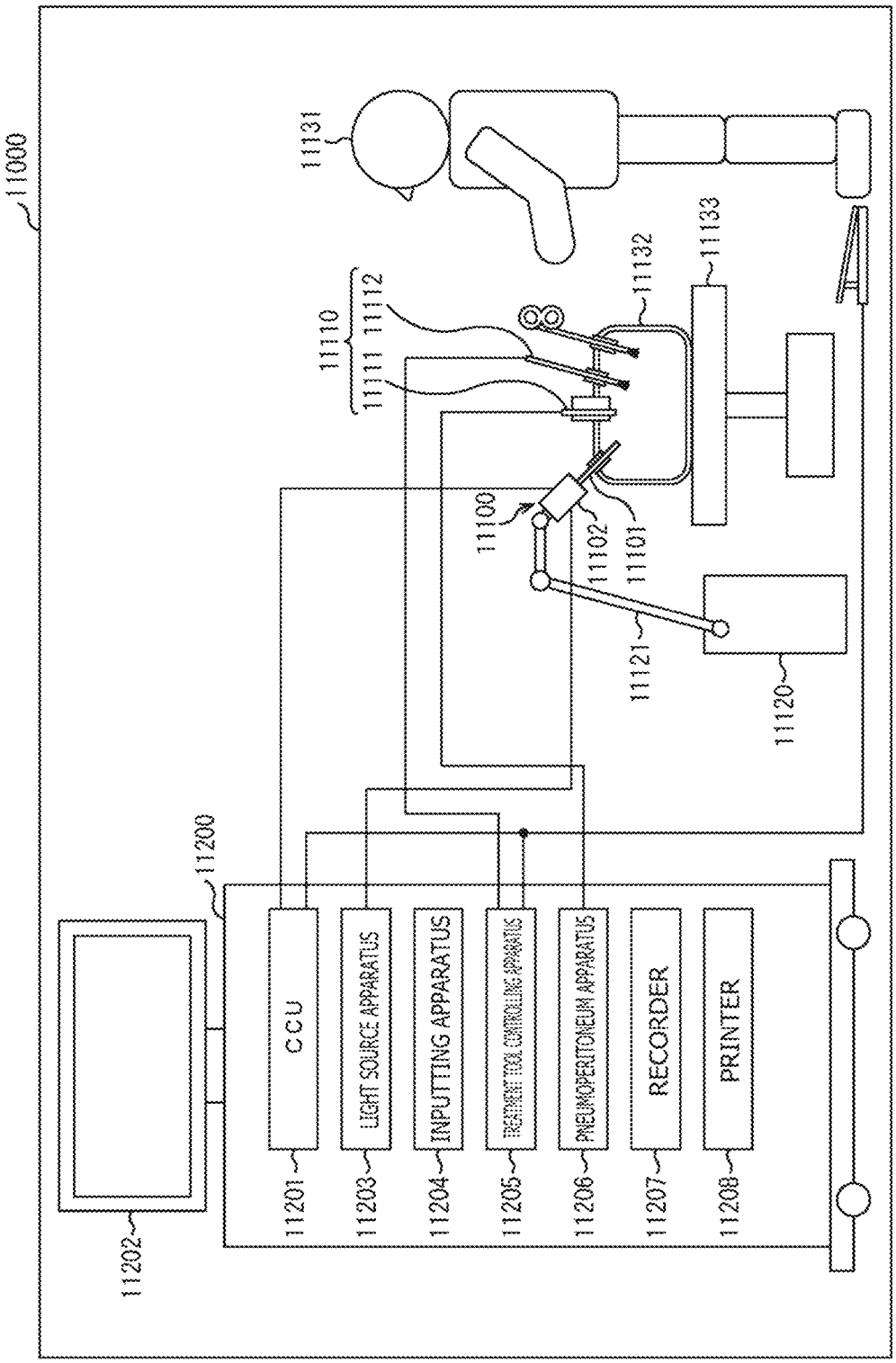
FIG. 36 is a view depicting an example of a schematic configuration of an endoscopic surgery system.
Figure 37:
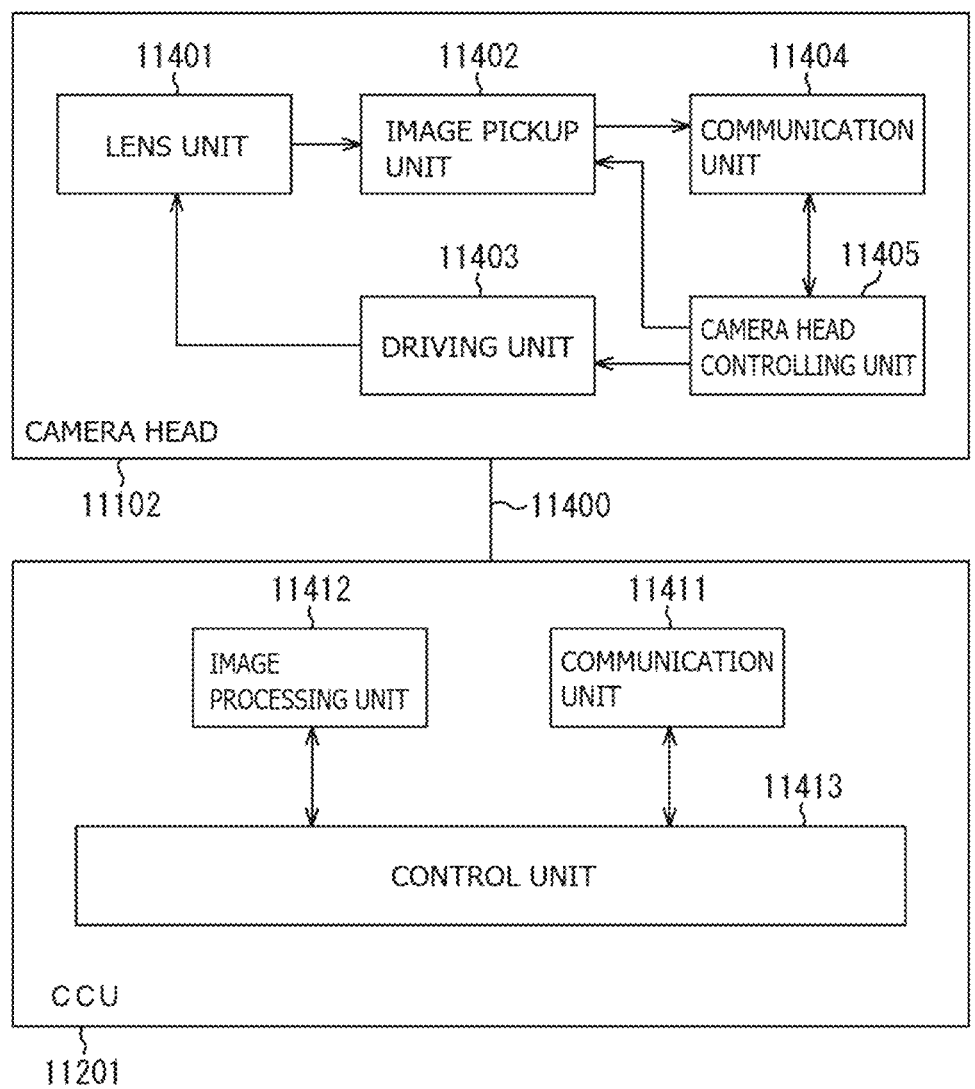
FIG. 37 is a block diagram depicting an example of a functional configuration of a camera head and a camera control unit (CCU).

The following describes embodiments of the present disclosure in detail with reference to the drawings. It is to be noted that description is given in the following order.
1. First Embodiment (Solid-State Imaging Device) . . . FIGS. 1 to 7
2. Modification Examples (Solid-State Imaging Devices) of First Embodiment
Modification Example A . . . FIGS. 8 to 17
Modification Example B FIGS. 18 to 20
Modification Example C FIGS. 21 to 24
Modification Example D . . . FIG. 25
Modification Example E . . . FIG. 26
3. Second Embodiment (Solid-State Imaging Device) . . . FIGS. 27 to 30
4. Modification Example (Solid-State Imaging Device) of Second Embodiment
Modification Example F FIGS. 31 and 32
5. Application Example (Imaging System) . . . FIG. 33
6. Practical Application Examples
Practical Application Example 1 . . . An example in which the solid-state imaging devices according to the above-described embodiments and modification examples thereof are each applied to a mobile body (FIGS. 34 and 35)
Practical Application Example 2 . . . An example in which the solid-state imaging devices according to the above-described embodiments and modification examples thereof are each applied to a surgery system (FIGS. 36 and 37)

1. Embodiment

[Configuration]

Figure 1:
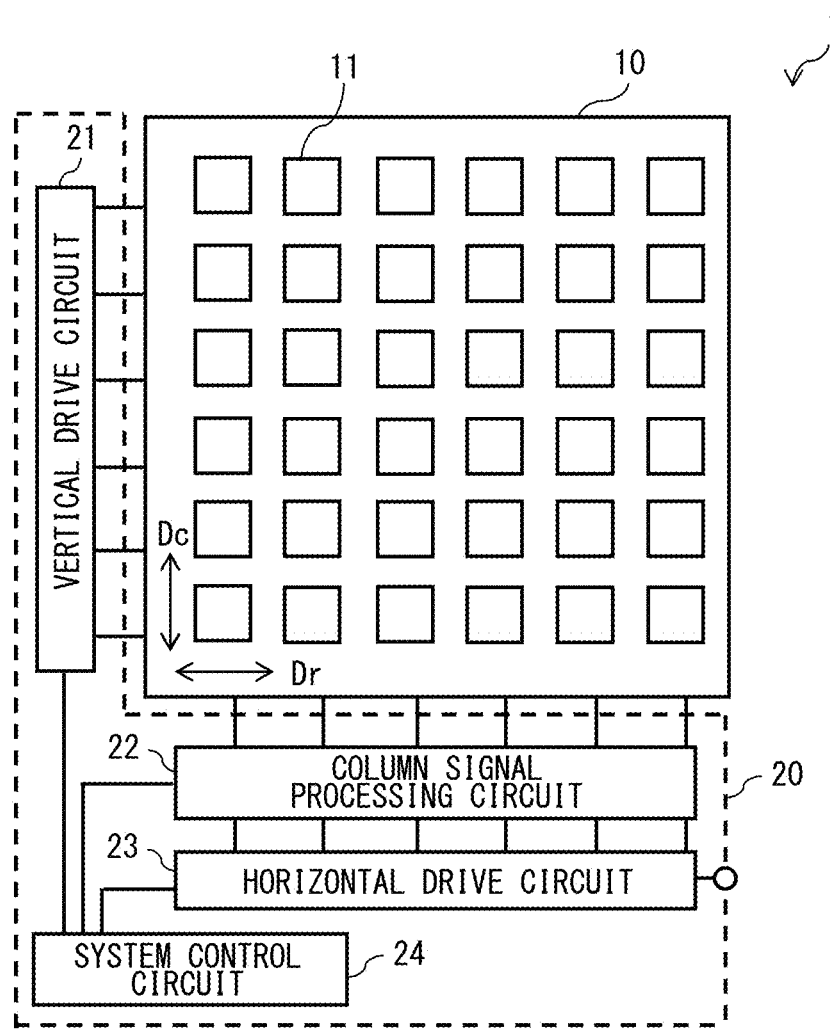
FIG. 1 is a diagram illustrating an example of a schematic configuration of a solid-state imaging device according to a first embodiment of the present disclosure.

FIG. 1 illustrates an example of a schematic configuration of a solid-state imaging device 1 according to an embodiment of the present disclosure. The solid-state imaging device 1 includes a pixel region 10. In the pixel region 10, a plurality of pixels 11 are disposed in a matrix. FIG. 1 illustrates Dr as a sign indicating a row direction and Dc as a sign indicating a column direction. FIG. 2 illustrates an example of a cross-sectional configuration of the pixel 11. FIG. 3 illustrates an example of a circuit configuration of the pixel 11 and a component therearound.

The solid-state imaging device 1 includes a plurality of pixel circuits 12, a plurality of drive wiring lines VOA, and a plurality of data output lines VSL. The pixel circuit 12 outputs a pixel signal based on an electric charge outputted from the pixel 11. Each of the drive wiring lines VOA is a wiring line to which a control signal is applied. The control signal is for controlling the output of the electric charges accumulated in the pixel 11. The drive wiring line VOA extends, for example, in the row direction Dr. Each of the data output lines VSL is a wiring line for outputting a pixel signal outputted from each pixel circuit 12 to a logic circuit 20. The data output line VSL extends, for example, in the column direction Dc.

The solid-state imaging device 1 includes the logic circuit 20 that processes a pixel signal. The logic circuit 20 includes, for example, a vertical drive circuit 21, a column signal processing circuit 22, a horizontal drive circuit 23, and a system control circuit 24. The logic circuit 20 generates an output voltage on the basis of a pixel signal obtained from each of the pixels 11 and outputs the output voltage to the outside.

For example, the vertical drive circuit 21 selects the plurality of pixels 11 in order for each predetermined unit pixel row. The "predetermined unit pixel row" refers to a pixel row whose pixels are selectable by the same address. For example, in a case where the plurality of pixels 11 shares the one pixel circuit 12 and the plurality of pixels 11 sharing the pixel circuit 12 has a layout of two pixel rows×n pixel columns (n represents an integer greater than 1), the "predetermined unit pixel row" refers to two pixel rows. Similarly, in a case where the plurality of pixels 11 sharing the pixel circuit 12 has a layout of four pixel rows×n pixel columns (n represents an integer greater than 1), the "predetermined unit pixel row" refers to four pixel rows.

The column signal processing circuit 22 performs a correlated double sampling (Correlated Double Sampling: CDS) process, for example, on a pixel signal outputted from each of the pixels 11 in a row selected by the vertical drive circuit 21. The column signal processing circuit 22 extracts the signal level of the pixel signal, for example, by performing the CDS process and holds pixel data corresponding to the amount of received light of each of the pixels 11. The column signal processing circuit 22 includes, for example, a column signal processing section 22A for each of the data output lines VSL. The column signal processing section 22A includes, for example, a single-slope A/D conversion device. The single-slope A/D conversion device includes, for example, a comparator and a counter circuit. The horizontal drive circuit 23 outputs, for example, the pieces of pixel data held in the column signal processing circuit 22 to outside in series. The system control circuit 24 controls, for example, the driving of the respective blocks (the vertical drive circuit 21, the column signal processing circuit 22, and the horizontal drive circuit 23) in the logic circuit 20.

For example, as illustrated in FIG. 2, the pixels 11 each include a stacked photoelectric converter in which three photoelectric conversion elements 110, 120, and 130 are stacked. The three photoelectric conversion elements 110, 120, and 130 each have different wavelength selectivity. That is, the solid-state imaging device 1 includes the above-described stacked photoelectric converter for each of the pixels 11. The pixel 11 further includes an on-chip lens 160 at a portion opposed to the above-described stacked photoelectric converter. That is, the solid-state imaging device 1 includes the on-chip lens 160 for each of the pixels 11. The photoelectric conversion element 110 is formed, for example, in insulating layers (insulating layers 115 and 116 and protective layer 117) on a semiconductor substrate 140. For example, the photoelectric conversion element 110 includes an electrode 111, a photoelectric conversion layer 112, and an electrode 113 stacked in this order from the semiconductor substrate 140 side. The semiconductor substrate 140 includes, for example, a silicon substrate.

The photoelectric conversion element 110 further includes, for example, an electric charge accumulating electrode 114 in the same layer as the electrode 111. The electric charge accumulating electrode 114 is disposed apart from the electrode 111. The electric charge accumulating electrode 114 is disposed to be opposed to the photoelectric conversion layer 112 with the insulating layer 116 interposed therebetween. The electrode 111 and the electric charge accumulating electrode 114 are covered with the insulating layers 115 and 116. The electrode 111 is in contact with the photoelectric conversion layer 112 via an opening of the insulating layer 116. The electrode 113 is a solid film formed in contact with surfaces of the photoelectric conversion layer 112 and the insulating layer 116. The electrode 113 includes, for example, the same layer as that of the electrode 113 of the adjacent pixel 11.

The photoelectric conversion element 110 includes, for example, the photoelectric conversion layer 112 that absorbs green light (light in a wavelength range of 495 nm or more and 570 nm or less) and has sensitivity to green light. The photoelectric conversion layer 112 includes, for example, an organic material that absorbs green light. Examples of such an organic material include a rhodamine-based dye, a merocyanine-based dye, quinacridone, and the like. It is to be noted that the photoelectric conversion layer 112 may include a material different from the organic material. The insulating layers 115 and 116 and the protective layer 117 each include, for example, $SiO_2$, SiN, or the like. The electrodes 111 and 113 each include, for example, a transparent electrically conductive material. Examples of the transparent electrically conductive material include ITO (Indium Tin Oxide), IZO (Indium Zinc Oxide), and the like. It is to be noted that the photoelectric conversion layer 112 is not limited to an organic material, but may include, for example, an inorganic material. Examples of such an inorganic material include silicon, selenium, amorphous selenium, a chalcopyrite-based compound, a III-V group compound, and a compound semiconductor (e.g., CdSe, CdS, ZnSe, ZnS, PbSe, PbS, and the like). The photoelectric conversion layer 112 may include a quantum dot including the above-described inorganic material.

The photoelectric conversion element 110 is coupled, for example, to a wiring line 156 via a contact hole 153 or the like provided to the semiconductor substrate 140. The wiring line 156 is provided to the back surface of the semiconductor substrate 140. The wiring line 156 electrically couples the electrode 111 of the photoelectric conversion element 110 and the pixel circuit 12 (e.g., gate electrode 157 of an amplification transistor in the pixel circuit 12) for the photoelectric conversion element 110.

The photoelectric conversion elements 120 and 130 are each formed, for example, in the semiconductor substrate 140. The photoelectric conversion element 120 includes, for example, an n-type semiconductor region 141 as a photoelectric conversion layer. The n-type semiconductor region 141 is formed near the front surface of the semiconductor substrate 140. The photoelectric conversion element 120 includes, for example, the n-type semiconductor region 141 that absorbs blue light (light in a wavelength range of 425 nm or more and 495 nm or less) and has sensitivity to blue light. The photoelectric conversion element 120 is coupled, for example, to a wiring line via a transfer transistor TR provided to the semiconductor substrate 140. The wiring line is provided to the back surface of the semiconductor substrate 140. This wiring line electrically couples the n-type semiconductor region 141 and the pixel circuit 12 for the photoelectric conversion element 120. It is to be noted that FIG. 2 exemplifies a gate electrode 158 of the transfer transistor TR electrically coupled to the photoelectric conversion element 120.

A photoelectric conversion element 130 includes, for example, an n-type semiconductor region 142 as a photoelectric conversion layer. The n-type semiconductor region 142 is formed in a region of the semiconductor substrate 140 deeper than the n-type semiconductor region 141. The photoelectric conversion element 130 includes, for example, the n-type semiconductor region 142 that absorbs red light (light in a wavelength range of 620 nm or more and 750 nm or less) and has sensitivity to red light. The photoelectric conversion element 130 is coupled, for example, to a wiring line via the transfer transistor TR provided to the semiconductor substrate 140. The wiring line is provided to the back surface of the semiconductor substrate 140. This wiring line electrically couples the n-type semiconductor region 142 and the pixel circuit 12 (e.g., gate electrode 159 of an amplification transistor in the pixel circuit 12) for the photoelectric conversion element 130.

The semiconductor substrate 140 includes a p+ layer 145 between the n-type semiconductor region 141 and the front surface of the semiconductor substrate 140. The p+ layer 145 suppresses the generation of dark currents. The semiconductor substrate 140 further includes a p+ layer 143 between the n-type semiconductor region 141 and the n-type semiconductor region 142. The p+ layer 143 further surrounds a portion of the side surface of the n-type semiconductor region 142 (e.g., near the gate electrode 158). The p+ layer 143 separates the n-type semiconductor region 141 and the n-type semiconductor region 142. The semiconductor substrate 140 includes a p+ layer 144 near the back surface of the semiconductor substrate 140. The p+ layer 144 suppresses the generation of dark currents. The back surface of the semiconductor substrate 140 is provided with an insulating film 154 and a $HfO_2$ film 151 and an insulating film 152 are stacked on the front surface of the semiconductor substrate 140. The $HfO_2$ film 151 is a film having a negative fixed charge and providing such a film allows the generation of dark currents to be suppressed. For example, a wiring line that electrically couples the photoelectric conversion elements 110, 120, and 130 and the pixel circuit 12 to each other and am insulating layer 155 that covers the pixel circuit 12 and the like are formed on the back surface of the semiconductor substrate 140.

It is to be noted that the photoelectric conversion elements 110, 120, and 130 are preferably disposed in the vertical direction in the order of the photoelectric conversion element 110, the photoelectric conversion element 120, and the photoelectric conversion element 130 from the light incidence direction (on-chip lens 160 side). This is because light having a shorter wavelength is more efficiently absorbed on the incidence surface side. Red light has the longest wavelength of the three colors and it is thus preferable that the photoelectric conversion element 130 be positioned in the lowest layer as viewed from the light incidence surface. The stacked structure of these photoelectric conversion elements 110, 120, and 130 is included in one stacked photoelectric converter.

Figure 4:
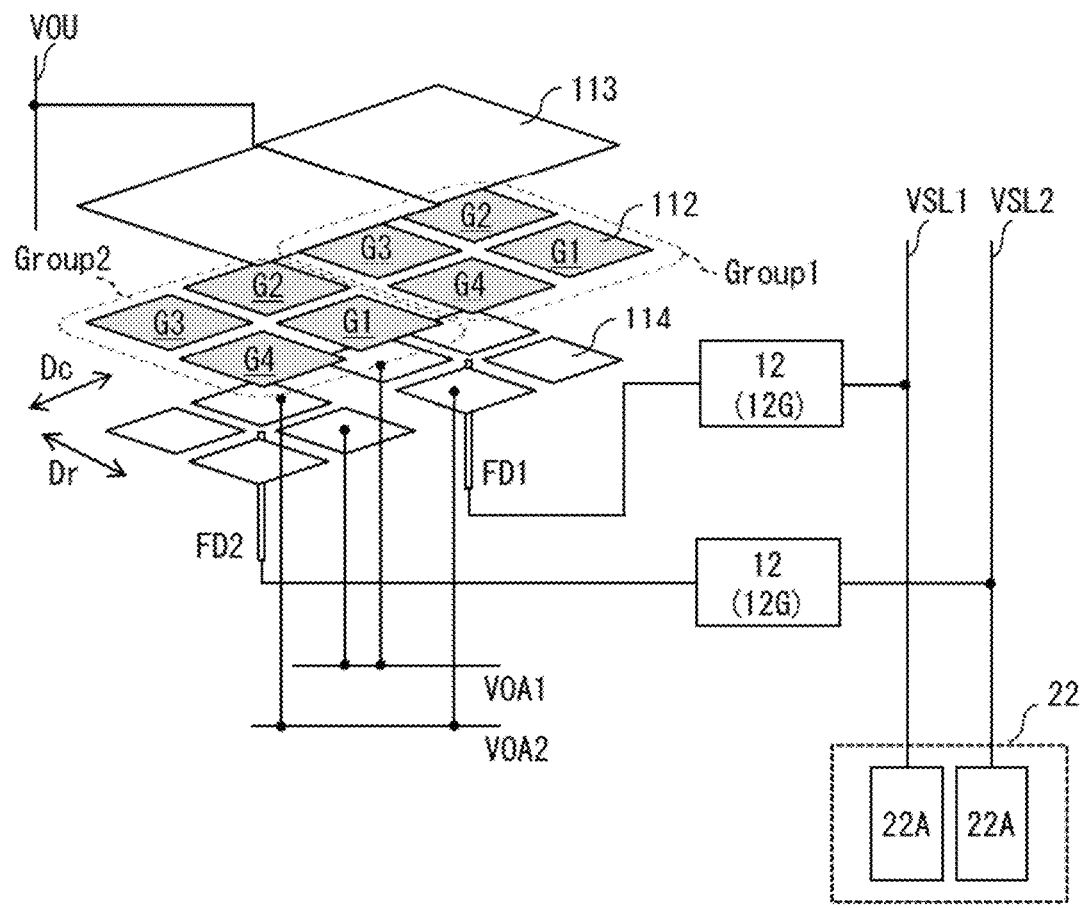
FIG. 4 is a diagram illustrating an example of the circuit configuration of the pixel and the component therearound in FIG. 1.

FIG. 4 illustrates an example of a circuit configuration of the pixel 11 (specifically, the photoelectric conversion element 110) and a component therearound. FIG. 4 is a perspective view of the circuit configuration illustrated in FIG. 3. FIG. 5 illustrates an example of a circuit configuration of the pixels 11 (specifically, the photoelectric conversion elements 120 and 130) and a component therearound. FIG. 6 is a diagram in which the circuit configurations illustrated in FIGS. 3 to 5 are simplified. FIGS. 3 to 6 each illustrate a circuit configuration in a "predetermined unit pixel column". In a case where the one pixel circuit 12 shares the plurality of pixels 11 and the plurality of pixels 11 sharing the pixel circuit 12 has a layout of m pixel rows×two pixel columns (m represents an integer greater than 1), the "predetermined unit pixel column" refers to two pixel columns. Similarly, in a case where the plurality of pixels 11 sharing the pixel circuit 12 has a layout of m pixel rows×four pixel columns (m represents an integer greater than 1), the "predetermined unit pixel column" refers to four pixel columns.

As described above, each of the pixels 11 has a structure in which the photoelectric conversion elements 110, 120, and 130 are stacked and the plurality of pixels 11 is disposed in a matrix in the pixel region 10. This causes the plurality of photoelectric conversion elements 110 to be disposed in a matrix in a layer closer to the light incidence surface of the pixel region 10 and causes the plurality of photoelectric conversion elements 130 to be disposed in a matrix in a layer closer to the surface opposite to the light incidence surface of the pixel region 10. Further, the plurality of photoelectric conversion elements 120 is disposed in a matrix in the layer between the layer in which the plurality of photoelectric conversion elements 110 is disposed and the layer in which the plurality of photoelectric conversion elements 130 is disposed in the pixel region 10.

The pixel circuit 12 is coupled to each of the photoelectric conversion elements 110 (specifically, electrodes 111). The pixel circuit 12 is coupled to each of the photoelectric conversion elements 120 via the transfer transistor TR. The pixel circuit 12 is coupled to each of the photoelectric conversion elements 130 via the transfer transistor TR. The following sometimes refers to the photoelectric conversion element 110 as photoelectric conversion section 11G for convenience and further simply as photoelectric conversion section G, photoelectric conversion section G1, photoelectric conversion section G2, photoelectric conversion section G3, or photoelectric conversion section G4. In addition, a circuit including the photoelectric conversion element 120 and the transfer transistor TR is sometimes referred to as photoelectric conversion section 11B and further simply as photoelectric conversion section B. In addition, a circuit including the photoelectric conversion element 130 and the transfer transistor TR is sometimes referred to as photoelectric conversion section 11R and further simply as photoelectric conversion section R.

As illustrated in FIG. 3, the pixel circuit 12 includes, for example, a floating diffusion FD, a reset transistor RST, a selection transistor SEL, and an amplification transistor AMP. The floating diffusion FD temporarily holds electric charges outputted from the photoelectric conversion sections 11G, 11B, and 11R. The source of the reset transistor RST is coupled to the floating diffusion FD and the drain of the reset transistor RST is coupled to a power supply line VDD and the drain of the amplification transistor AMP. The gate of the reset transistor RST is coupled to the vertical drive circuit 21 via a control line (not illustrated). The source of the amplification transistor AMP is coupled to the drain of the selection transistor SEL and the gate of the amplification transistor AMP is coupled to the floating diffusion FD. The source of the selection transistor SEL is coupled to the column signal processing circuit 22 via the data output line VSL and the gate of the selection transistor SEL is coupled to the vertical drive circuit 21 via a control line (not illustrated). It is to be noted that the electric charge accumulating electrode 114 of the photoelectric conversion section 11G is coupled to the vertical drive circuit 21 via the drive wiring line VOA. In addition, the electrode 113 of the photoelectric conversion section 11G is coupled to the vertical drive circuit 21 via a drive wiring line VOU.

In a case where the transfer transistor TR is turned on, the transfer transistor TR transfers the electric charges of the photoelectric conversion sections 11B and 11R to the floating diffusion FD. The reset transistor RST resets the potential of the floating diffusion FD to a predetermined potential. In a case where the reset transistor RST is turned on, the reset transistor RST resets the potential of the floating diffusion FD to the potential of the power supply line VDD.

The selection transistor SEL controls the output timing of a pixel signal from the pixel circuit 12. The amplification transistor AMP generates, as a pixel signal, a signal of the voltage corresponding to the level of the electric charge held in the floating diffusion FD. The amplification transistor AMP is included in an amplifier of a source follower type and outputs pixel signals of the voltages corresponding to the levels of the electrical charges generated in the photoelectric conversion sections 11G, 11B, and 11R. In a case where the selection transistor SEL is turned on, the amplification transistor AMP amplifies the potential of the floating diffusion FD and outputs the voltage corresponding to the potential to the column signal processing circuit 22 via the data output line VSL. The transfer transistor TR, the reset transistor RST, the amplification transistor AMP, and the selection transistor SEL are, for example, NMOS transistors. The pixel circuit 12 is formed, for example, on the back surface of the semiconductor substrate 140.

The plurality of pixel circuits 12 provided to the solid-state imaging device 1 includes a plurality of pixel circuits 12G and a plurality of pixel circuits 12BR. The plurality of pixel circuits 12G is assigned to the photoelectric conversion sections 11G. The plurality of pixel circuits 12BR is assigned to the photoelectric conversion sections 11B and 11R. The pixel circuits 12G output pixel signals based on electric charges outputted from the photoelectric conversion sections 11G each having predetermined wavelength selectivity. The pixel circuits 12BR output pixel signals based on electric charges outputted from the photoelectric conversion sections 11B and 11R each having predetermined wavelength selectivity.

(Relationship Between Photoelectric Conversion Section 11G and Pixel Circuit 12G)

The plurality of pixel circuits 12G is each provided to the plurality of photoelectric conversion sections 11G having the same wavelength selectivity. The plurality of respective pixel circuits 12G is provided to groups obtained by dividing the plurality of photoelectric conversion sections 11G provided to the solid-state imaging device 1 into a plurality of groups. The respective groups include the same number of photoelectric conversion sections 11G.

Here, in the plurality of photoelectric conversion sections 11G, each group is set for the plurality of photoelectric conversion sections 11G sharing the floating diffusion FD. For example, in a case where the four photoelectric conversion sections 11G share the one floating diffusion FD, the four photoelectric conversion sections 11G sharing the floating diffusion FD form one group.

In contrast, each of the drive wiring lines VOA is not shared in units of groups each defined by the pixel circuits 12G and the floating diffusion FD. Each of the drive wiring lines VOA is shared between two groups defined by the pixel circuits 12G and the floating diffusions FD. Specifically, in a case where the plurality of photoelectric conversion sections 11G belonging to a group Group1 and the plurality of photoelectric conversion sections 11G belonging to a group Group2 are brought into focus, each of the drive wiring lines VOA is coupled to the photoelectric conversion sections 11G belonging to the group Group1 and the photoelectric conversion sections 11G belonging to the group Group2 in each of unit pixel columns corresponding to the shared pixel circuits 12G. The plurality of photoelectric conversion sections 11G belonging to the group Group1 and the plurality of photoelectric conversion sections 11G belonging to the group Group2 share the different pixel circuits 12G.

Here, in the present embodiment, the two data output lines VSL are provided to the solid-state imaging device 1 for each of the unit pixel columns corresponding to the shared pixel circuits 12G. In each of the unit pixel columns, one (VSL1) of the data output lines VSL is coupled to the pixel circuit 12G corresponding to the group Group1 and the other (VSL2) of the data output lines VSL is coupled to the pixel circuit 12G corresponding to the group Group2. Further, the photoelectric conversion section 11G (e.g., G3) belonging to the group Group1 and the photoelectric conversion section 11G (e.g., G1) belonging to the group Group2 are alternately disposed in the direction (Dc) parallel with the unit pixel column. A drive wiring line VOA1 is coupled to the photoelectric conversion section 11G (e.g., G3) belonging to the group Group1 and the photoelectric conversion section 11G (e.g., G1) belonging to the group Group2. Similarly, the photoelectric conversion section 11G (e.g., G4) belonging to the group Group1 and the pixel circuit 12G (e.g., G2) belonging to the group Group2 are alternately disposed in the direction parallel with the unit pixel column. A drive wiring line VOA2 is coupled to the photoelectric conversion section 11G (e.g., G4) belonging to the group Group1 and the pixel circuit 12G (e.g., G2) belonging to the group Group2.

(Relationship Between Photoelectric Conversion Sections 11BR and Pixel Circuit 12BR)

The plurality of pixel circuits 12BR is each provided to the plurality of photoelectric conversion sections 11B and 11R each having predetermined wavelength selectivity. The plurality of respective pixel circuits 12BR is provided to groups obtained by dividing the plurality of photoelectric conversion sections 11B and 11R provided to the solid-state imaging device 1 into a plurality of groups. The respective groups include the same number of photoelectric conversion sections 11B. Similarly, the respective groups include the same number of photoelectric conversion sections 11R.

Here, in the plurality of photoelectric conversion sections 11B and 11R, each group is set for the plurality of photoelectric conversion sections 11B and 11R sharing the plurality of floating diffusions FD coupled to each other via a wiring line. For example, in a case where the four photoelectric conversion sections 11B and the four photoelectric conversion sections 11R share the two floating diffusions FD coupled to each other via a wiring line, the four photoelectric conversion sections 11B and the four photoelectric conversion sections 11R that share the two floating diffusions FD form one group.

As described above, the two data output lines VSL are provided to the solid-state imaging device 1 for each of the unit pixel columns corresponding to the shared pixel circuits 12G. In each of unit pixel columns, the one (VSL1) of the data output lines VSL is coupled to the pixel circuit 12BR corresponding to a group Group3. Here, the plurality of photoelectric conversion sections 11B and 11R sharing the plurality of floating diffusions FD belongs to the group Group3. The plurality of floating diffusions FD is coupled to each other via a wiring line. That is, the group Group3 includes the plurality of photoelectric conversion sections 11B and 11R each having different wavelength selectivity. Thus, in each of unit pixel columns, the one (VSL1) of the data output lines VSL is coupled to the respective photoelectric conversion sections 11B and 11R belonging to the group Group3 via the pixel circuit 12BR corresponding to the group Group3.

In each of unit pixel columns, the other data output line VSL (VSL2) is coupled to the pixel circuit 12BR corresponding to a group Group4. Here, the plurality of photoelectric conversion sections 11B and 11R sharing the plurality of floating diffusions FD belongs to the group Group4. The plurality of floating diffusions FD is coupled to each other via a wiring line. That is, the group Group4 includes the plurality of photoelectric conversion sections 11B and 11R each having different wavelength selectivity. Thus, in each of unit pixel columns, the other data output line VSL (VSL2) is coupled to the respective photoelectric conversion sections 11B and 11R belonging to the group Group4 via the pixel circuit 12BR corresponding to the group Group4.

The plurality of photoelectric conversion sections 11G belonging to the group Group1 and the plurality of photoelectric conversion sections 11B and 11R belonging to the group Group3 may be disposed at the positions directly opposed to each other in the thickness direction of the pixel region 10 or disposed at the positions shifted by one pixel row or one pixel column from the positions directly opposed to each other in the thickness direction of the pixel region 10. Similarly, the plurality of photoelectric conversion sections 11G belonging to the group Group2 and the plurality of photoelectric conversion sections 11B and 11R belonging to the group Group4 may be disposed at the positions directly opposed to each other in the thickness direction of the pixel region 10 or disposed at the positions shifted by one pixel row or one pixel column from the positions directly opposed to each other in the thickness direction of the pixel region 10.

[Readout Operation]

Figure 7:
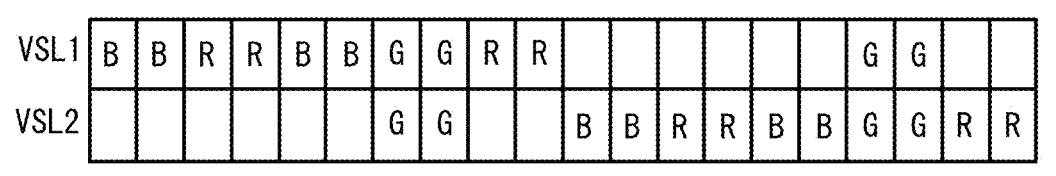

FIG. 7 illustrates an example of data output in the solid-state imaging device 1 having the circuit configuration illustrated in FIG. 6.

First, the readout of an electric charge from the photoelectric conversion section 11G is described.

The vertical drive circuit 21 applies a potential $V_{11}$ to the electrode 111 and applies a potential $V_{12}$ ($V_{12}>V_{11}$) to the electric charge accumulating electrode 114 in an electric charge accumulation period. Light incident on the photoelectric conversion layer 112 is then photoelectrically converted in the photoelectric conversion layer 112 and the holes generated by this are transmitted from the electrode 113 to the vertical drive circuit 21 via the drive wiring line VOU. The vertical drive circuit 21 further applies a positive potential to the electrode 111 and applies a negative potential to the electrode 113. This causes the electrons generated through photoelectric conversion to be attracted to the electric charge accumulating electrode 114 and stay near the electric charge accumulating electrode 114 of the photoelectric conversion layer 112. That is, the electric charges are stored in the photoelectric conversion layer 112. It is to be noted that the electrons generated inside the photoelectric conversion layer 112 do not move toward the electrode 111 because $V_{12}>V_{11}$. The potential near the electric charge accumulating electrode 114 of the photoelectric conversion layer 112 has a more negative value with the elapsed time of photoelectric conversion.

The vertical drive circuit 21 performs a reset operation in the latter half of the electric charge accumulation period. This resets the potential of the floating diffusion FD and the potential of the floating diffusion FD is equal to the potential of the power supply line VDD.

The vertical drive circuit 21 reads out an electric charge after the reset operation is completed. That is, the vertical drive circuit 21 applies a potential $V_{21}$ to the electrode 111 and applies a potential $V_{22}$ ($V_{22}>V_{21}$) to the electric charge accumulating electrode 114 in an electric charge transfer period. This causes the electrons staying near the electric charge accumulating electrode 114 of the photoelectric conversion layer 112 to be read out to the electrode 111 and further to the floating diffusion FD. That is, the electric charges accumulated in the photoelectric conversion layer 112 are read out to the column signal processing circuit 22. The readout of electric charges from the photoelectric conversion section 11G is completed by performing a series of operations such as accumulating electric charges, performing a reset operation, and transferring electric charges in this way.

Next, the readout of electric charges from the photoelectric conversion sections 11B and 11R is described.

Light incident on the n-type semiconductor region 141 is photoelectrically converted in the n-type semiconductor region 141 and the electric charges generated by this are accumulated in the n-type semiconductor region 141. The vertical drive circuit 21 then applies an on voltage to the gate electrode 158 of the transfer transistor TR. This causes the electric charges accumulated in the n-type semiconductor region 141 to be read out to the floating diffusion FD via the transfer transistor TR. That is, the electric charges accumulated in the n-type semiconductor region 141 are read out to the column signal processing circuit 22. The readout of electric charges from the photoelectric conversion section 11B is completed in this way.

Light that passes through the n-type semiconductor region 141 and is incident on the n-type semiconductor region 142 is photoelectrically converted in the n-type semiconductor region 142 and the electric charges generated by this are accumulated in the n-type semiconductor region 142. The vertical drive circuit 21 then applies an on voltage to the gate of the transfer transistor TR. This causes the electric charges accumulated in the n-type semiconductor region 142 to be read out to the floating diffusion FD via the transfer transistor TR. That is, the electric charges accumulated in the n-type semiconductor region 142 are read out to the column signal processing circuit 22. The readout of electric charges from the photoelectric conversion section 11R is completed in this way.

The vertical drive circuit 21 performs an operation of reading out electric charges from the photoelectric conversion sections 11G, 11B, and 11R by combining the above-described readout operations. The vertical drive circuit 21 performs readout operations in series on the two photoelectric conversion sections 11B and the two photoelectric conversion sections 11R and the two photoelectric conversion sections 11B at a first address (or group Group3), for example, as illustrated in FIGS. 6 and 7. This causes the electric charges of the two photoelectric conversion sections 11B and the two photoelectric conversion sections 11R and the two photoelectric conversion sections 11B at the first address to be read out in series to the column signal processing circuit 22 via the data output line VSL1.

Next, the vertical drive circuit 21 performs readout operations in series and in parallel on the two photoelectric conversion sections 11G at the first address (or group Group1) and the two photoelectric conversion sections 11G at a second address (or group Group2), for example, as illustrated in FIGS. 6 and 7. This causes the electric charges of the two photoelectric conversion sections 11G at the first address to be read out to the column signal processing circuit 22 in series via the data output line VSL1 and simultaneously causes the electric charges of the two photoelectric conversion sections 11G at the second address to be read to the column signal processing circuit 22 in series via the data output line VSL2.

Next, the vertical drive circuit 21 performs readout operations in series on the two unread photoelectric conversion sections 11R at the first address (or group Group3), for example, as illustrated in FIGS. 6 and 7. This causes the electric charges of the two unread photoelectric conversion sections 11R at the first address to be read out to the column signal processing circuit 22 in series via the data output line VSL1.

Next, the vertical drive circuit 21 performs readout operations in series on the two photoelectric conversion sections 11B and the two photoelectric conversion sections 11R and the two photoelectric conversion sections 11B at a second address (or group Group4), for example, as illustrated in FIGS. 6 and 7. This causes the electric charges of the two photoelectric conversion sections 11B, the two photoelectric conversion sections 11R, and the two photoelectric conversion sections 11B at the second address to be read out in series to the column signal processing circuit 22 via the data output line VSL2.

Next, the vertical drive circuit 21 performs readout operations in series and in parallel on the two unread photoelectric conversion sections 11G at the first address (or group Group1) and the two unread photoelectric conversion sections 11G at the second address (or group Group2), for example, as illustrated in FIGS. 6 and 7. This causes the electric charges of the two unread photoelectric conversion sections 11G at the first address to be read out to the column signal processing circuit 22 in series via the data output line VSL1 and simultaneously causes the electric charges of the two unread photoelectric conversion sections 11G at the second address to be read to the column signal processing circuit 22 in series via the data output line VSL2.

Finally, the vertical drive circuit 21 performs readout operations in series on the two unread photoelectric conversion sections 11R at the second address (or group Group4), for example, as illustrated in FIGS. 6 and 7. This causes the electric charges of the two unread photoelectric conversion sections 11R at the second address to be read out to the column signal processing circuit 22 in series via the data output line VSL1. The readout operations from the respective photoelectric conversion sections at the first address and the second address are completed in this way. Afterward, the vertical drive circuit 21 repeatedly performs readout operations from the respective photoelectric conversion sections in a similar method. The readout operation from each of the photoelectric conversion sections is completed in this way.

It is to be noted that the procedure of reading out electric charges from the respective photoelectric conversion sections at the first address and the second address is not limited to that of FIG. 7. For example, the vertical drive circuit 21 may perform readout operations to allow both of the data output lines VSL1 and VSL2 to be used for readout as simultaneously as possible.

[Effects]

Next, effects of the solid-state imaging device 1 according to the present embodiment are described.

In the present embodiment, each of the drive wiring lines VOA is coupled to the photoelectric conversion section 11G belonging to the group Group1 and the photoelectric conversion section 11G belonging to the group in each of unit pixel columns. This makes it possible to decrease the number of drive wiring lines VOA as compared with a case where the drive wiring line VOA is provided for each of the photoelectric conversion sections 11G. Here, the drive wiring lines VOA sometimes block light incident on the photoelectric conversion sections 11B and 11R provided in the lower portion of the stacked photoelectric converter. This makes it possible to increase the aperture ratios of the photoelectric conversion sections 11B and 11R by including less drive wiring lines VOA.

In addition, in the present embodiment, the two data output lines VSL are provided to each of unit pixel columns.

Further, in each of the unit pixel columns, the data output lines VSL1 that is one of the data output lines is coupled to the pixel circuit 12 (12G) corresponding to the group Group1 and the other data output lines VSL2 is coupled to the pixel circuit 12 (12G) corresponding to the group Group2. For example, this allows the electric charges of the photoelectric conversion sections 11G in the group Group1 and the electric charges of the photoelectric conversion sections 11G in the group Group2 to be simultaneously read out. This makes it possible to achieve higher data readout efficiency than in a case where each of unit pixel columns is provided with the only one data output line VSL.

In addition, in the present embodiment, the photoelectric conversion sections 11G belonging to the group Group1 and the photoelectric conversion sections 11G belonging to the group Group2 are alternately disposed in the direction parallel with the unit pixel column. Each of the drive wiring lines VOA is coupled to the photoelectric conversion sections 11G belonging to the group Group1 and the photoelectric conversion sections 11G belonging to the group Group2. This allows the respective data output lines VSL to have uniform capacity. As a result, it is possible to obtain uniform time constants when the potentials of the data output lines VSL change. This makes it possible to equalize the readout times.

In addition, in the present embodiment, the pixel circuit 12 (12BR) that outputs pixel signals based on electric charges outputted from the photoelectric conversion sections 11B and 11R is set for each of groups obtained by dividing the plurality of photoelectric conversion sections 11B and 11R into two groups (groups Group3 and Group4). Further, in a case where the plurality of photoelectric conversion sections 11B and 11R belonging to the group Group3 and the plurality of photoelectric conversion sections 11B and 11R belonging to the group Group4 are brought into focus, the data output line VSL1 that is one of the data output lines is coupled to the respective photoelectric conversion sections 11B and 11R belonging to the group Group3 and the other data output line VSL2 is coupled to the respective photoelectric conversion sections 11B and 11R belonging to the group Group4 in each of unit pixel columns. The plurality of photoelectric conversion sections 11B and 11R belonging to the group Group3 and the plurality of photoelectric conversion sections 11B and 11R belonging to the group Group4 share the different pixel circuits 12 (12BR). This allows the electric charges of the photoelectric conversion sections 11B and 11R in the group Group3 and the electric charges of the photoelectric conversion sections 11B and 11R in the group Group3 to be simultaneously read out.

In addition, in the present embodiment, each of the groups Group3 and Group4 includes the plurality of photoelectric conversion sections 11B and 11R each having different wavelength selectivity. This sometimes allows the plurality of photoelectric conversion sections 11B and 11R to have an efficient planar layout.

In addition, in the present embodiment, in a case where each of the photoelectric conversion sections 11G includes the photoelectric conversion layer 112 formed by using an organic material in each of stacked photoelectric converters, it is also possible to achieve a photoelectric conversion characteristic with a feature different from that of a semiconductor layer.

2. Modification Examples

The following describes modification examples of the solid-state imaging device 1 according to the above-described embodiment.

Modification Example A

Figure 8:
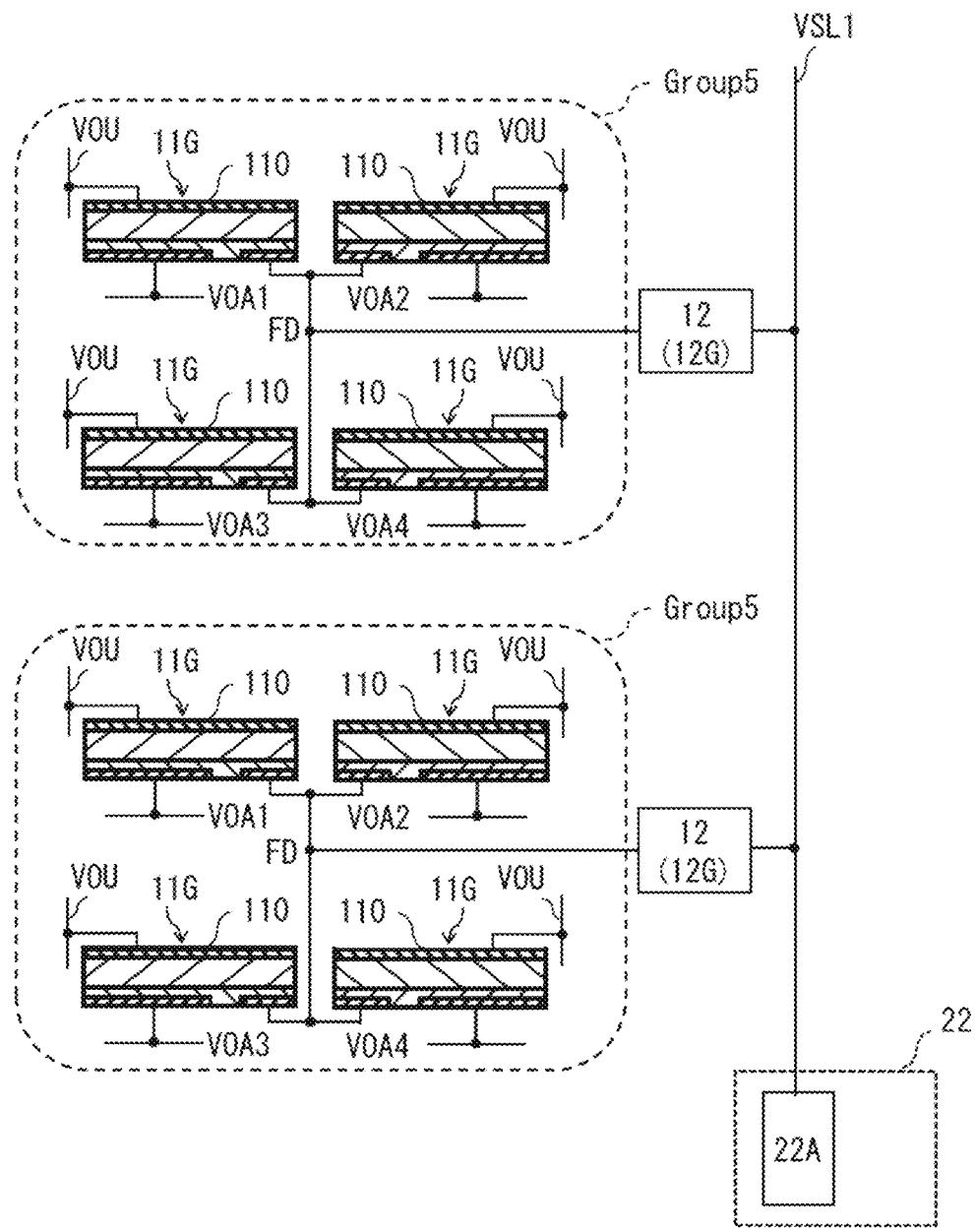
FIG. 8 is a diagram illustrating a modification example of the circuit configuration of the pixel and the component therearound in FIG. 1.

FIG. 8 illustrates a modification example of a circuit configuration of the photoelectric conversion section 11G according to the above-described embodiment and a component therearound. In the above-described embodiment, each of the drive wiring lines VOA is shared between the two groups Group1 and Group2 in a unit pixel column. In the above-described embodiment, each of the drive wiring lines VOA is not, however, shared between two groups in a unit pixel column, but the drive wiring line VOA may be provided for each of groups Group5. In this case, the drive wiring lines VOA that are equal in number to the photoelectric conversion sections 11G included in each of the groups Group5 are provided to each of the groups Group5 in a unit pixel column. That is, the plurality of respective drive wiring lines VOA is provided for the plurality of photoelectric conversion sections 11G sharing the pixel circuit 12G in each of unit pixel columns. For example, in a case where each of the groups Group5 includes the four photoelectric conversion sections 11G, the four drive wiring lines VOA are provided for each Group5 in a unit pixel column.

The plurality of photoelectric conversion sections 11G then shares the one floating diffusion FD in each of the groups Group5 and the pixel circuit 12G is coupled to this floating diffusion FD. That is, the plurality of pixel circuits 12G is each provided for the group Group5. Further, the respective pixel circuits 12G are then coupled to the same data output line VSL1 in a unit pixel column.

Figure 9:
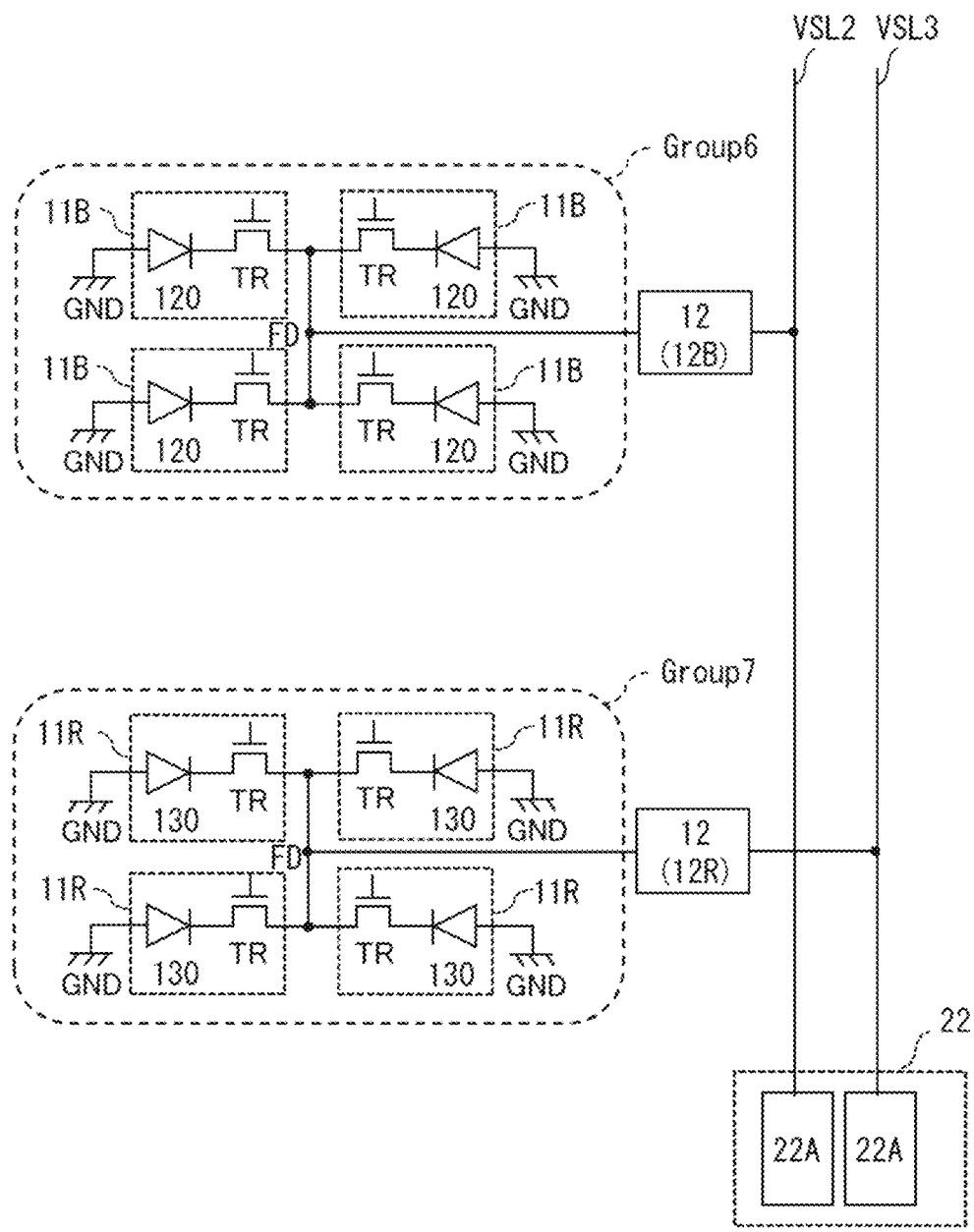
FIG. 9 is a diagram illustrating a modification example of the circuit configuration of the pixel and the component therearound in FIG. 1.

FIG. 9 illustrates a modification example of a circuit configuration of the photoelectric conversion sections 11B and 11R according to the above-described embodiment and components therearound. In the above-described embodiment, the groups Group3 and Group4 including the plurality of photoelectric conversion sections 11B and 11R are provided and the plurality of respective pixel circuits 12BR is provided for the groups Group3 and Group4. In the above-described embodiment, there may be, however, provided a group Group6 including the plurality of photoelectric conversion sections 11B and a group Group7 including the plurality of photoelectric conversion sections 11R instead of the groups Group3 and Group4.

In this case, there are provided a plurality of pixel circuits 12B and a plurality of pixel circuits 12R instead of the plurality of pixel circuits 12BR. The plurality of pixel circuits 12B is each provided for the group Group6 and the plurality of pixel circuits 12R is each provided for the group Group7. The plurality of photoelectric conversion sections 11B then shares the one floating diffusion FD in each of the groups Group6 and the pixel circuit 12B is coupled to this floating diffusion FD. In addition, the plurality of photoelectric conversion sections 11R shares the one floating diffusion FD in each of the groups Group7 and the pixel circuit 12R is coupled to this floating diffusion FD. Further, the respective pixel circuits 12B are then coupled to the same data output line VSL2 same in a unit pixel column and the respective pixel circuits 12R are coupled to the same data output line VSL3 in a unit pixel column.

Figure 10:
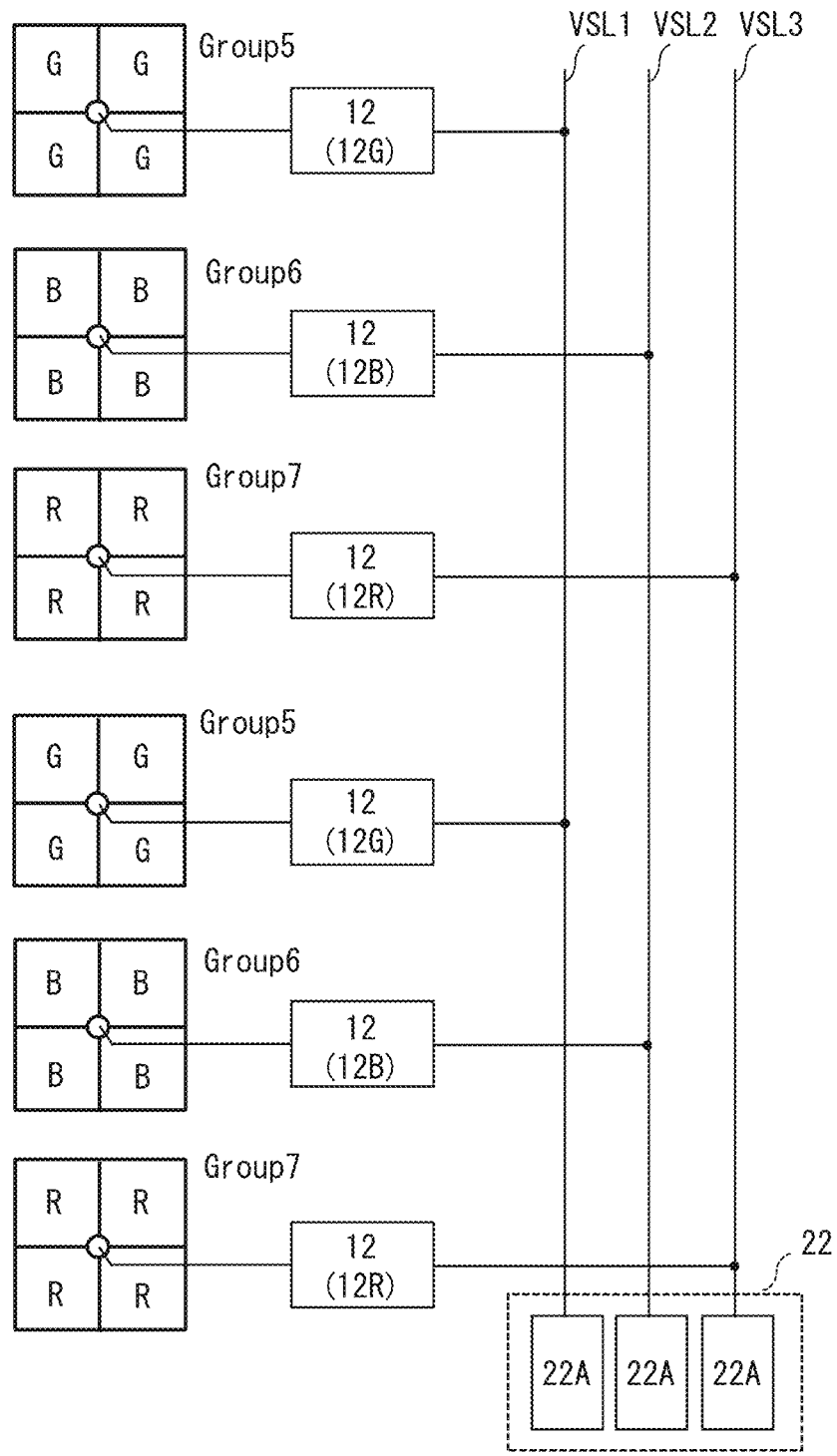
FIG. 10 is a diagram in which the circuit configurations illustrated in FIGS. 8 and 9 are simplified.

FIG. 10 is a diagram in which the circuit configurations illustrated in FIGS. 8 and 9 are simplified. The plurality of data output lines VSL is provided for each of unit pixel columns. The plurality of data output lines VSL is equal in number to an integer multiple of the photoelectric conversion elements 110, 120, and 130 stacked in the stacked photoelectric converter. In the present modification example, for example, as illustrated in FIG. 10, the three data output lines VSL (i.e., the same number of data output lines as the number of stacked layers) are provided to the solid-state imaging device 1 for each of unit pixel columns. In each of unit pixel columns, the respective data output lines VSL are provided for the wavelength selectivity types of the photoelectric conversion sections 11G, 11B, and 11R.

[Readout Operation]

Figure 11:
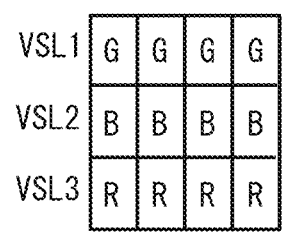

FIG. 11 illustrates an example of data output in the solid-state imaging device 1 having the circuit configuration illustrated in FIG. 10.

The vertical drive circuit 21 performs an operation of reading out electric charges from the photoelectric conversion sections 11G, 11B, and 11R by combining the readout operations mentioned in the above-described embodiment. The vertical drive circuit 21 simultaneously performs readout operations on the one photoelectric conversion section 11G, the one photoelectric conversion section 11R, and the one photoelectric conversion section 11B at the first address (or groups Group5, Group6, and Group7), for example, as illustrated in FIGS. 10 and 11. This causes the electric charges of the one photoelectric conversion section 11B, the one photoelectric conversion section 11R, and the one photoelectric conversion section 11B at the first address to be simultaneously read out to the column signal processing circuit 22 via the data output lines VSL1, VSL2, and VSL3.

Afterward, the vertical drive circuit 21 repeatedly performs readout operations simultaneously in a similar method on the one unread photoelectric conversion section 11G, the one photoelectric conversion section 11R, and the one photoelectric conversion section 11B belonging to the first address. The readout operation from each of the photoelectric conversion sections at the first address is completed in this way. The vertical drive circuit 21 repeatedly performs readout operations simultaneously in a similar method on the one photoelectric conversion section 11G, the one photoelectric conversion section 11R, and the one photoelectric conversion section 11B belonging to the second address. The readout operations from the respective photoelectric conversion sections at the first address and the second address are completed in this way. Afterward, the vertical drive circuit 21 repeatedly performs readout operations from the respective photoelectric conversion sections in a similar method. The readout operation from each of the photoelectric conversion sections is completed in this way.

[Effects]

Next, effects of the solid-state imaging device 1 according to the present modification example are described.

In the present modification example, the plurality of data output lines VSL is provided for each predetermined unit pixel column. The plurality of data output lines VSL is equal in number to the photoelectric conversion elements 110, 120, and 130 stacked in the stacked photoelectric converter. This allows data to be read out at higher speed than in a case where one data output line is provided for each predetermined unit pixel column.

In addition, in the present modification example, the plurality of respective pixel circuits 12 are provided for the groups Group5, Group6, and Group7. The plurality of respective data output lines VSL is provided for the wavelength selectivity types (three types) of the photoelectric conversion elements 110, 120, and 130 in each of unit pixel columns. This allows data to be read out at higher speed than in a case where one data output line is provided for each predetermined unit pixel column.

In addition, in the present modification example, the column signal processing section 22A is provided for each of the data output lines VSL. This allows pieces of data to be simultaneously read out from the respective data output lines VSL, allowing data to be read out at high speed.

In addition, in the present modification example, in a case where each of the photoelectric conversion sections 11G includes the photoelectric conversion layer 112 formed by using an organic material in each of stacked photoelectric converters, it is also possible to achieve a photoelectric conversion characteristic with a feature different from that of a semiconductor layer.

Figure 12:
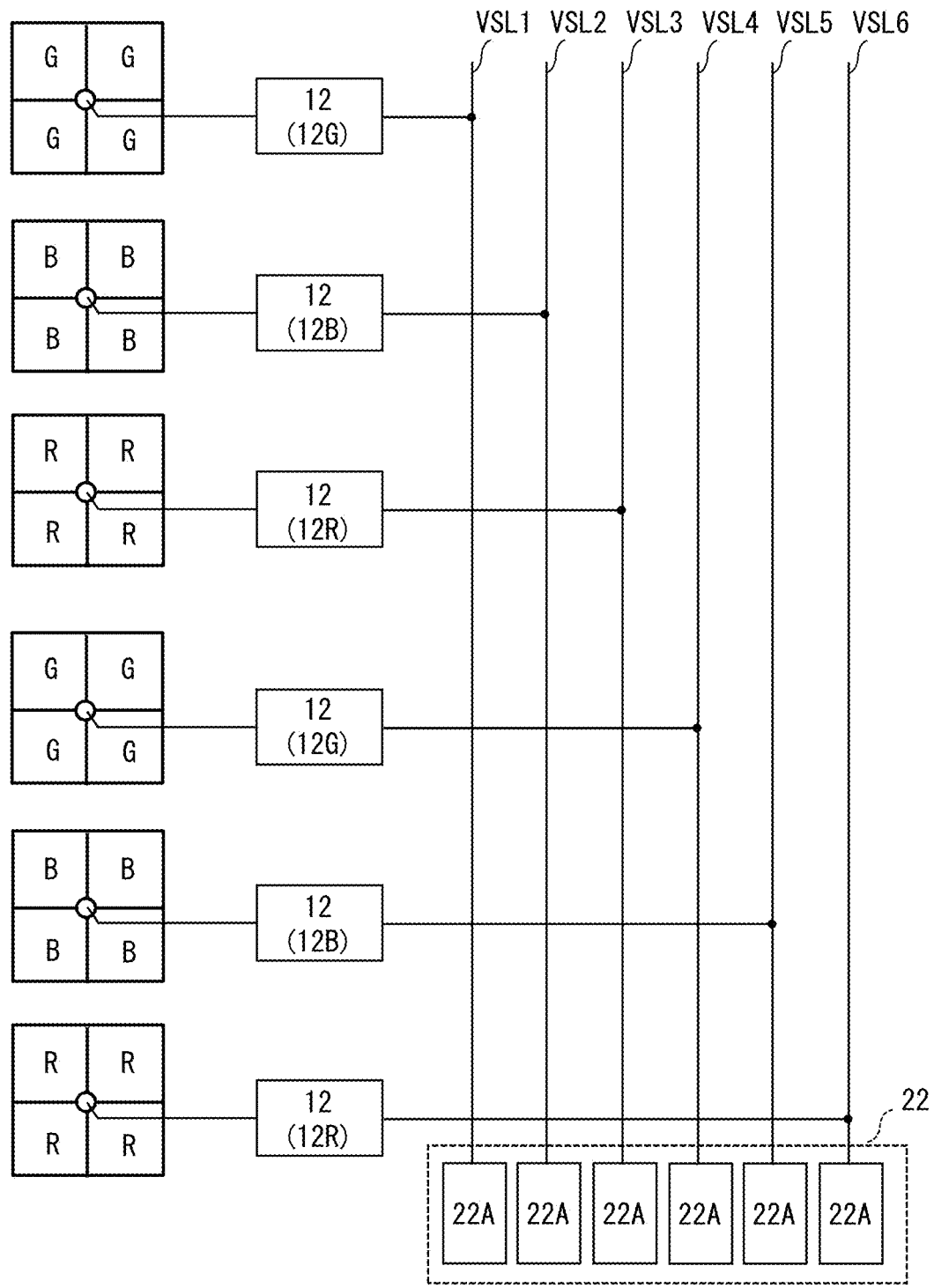
FIG. 12 is a diagram illustrating a modification example of the circuit configuration in FIG. 10.

In the present modification example, the plurality of data output lines VSL provided to the solid-state imaging device 1 may be for each of the wavelength selectivity types of the photoelectric conversion sections 11G, 11B, and 11R in each of unit pixel columns. For example, as illustrated in FIG. 12, the six data output lines VSL may be provided to the solid-state imaging device 1 in each of unit pixel columns. Here, the six data output lines VSL correspond to the double of stacked layers in number. This means that the two data output lines VSL are provided for each of the wavelength selectivity types of the photoelectric conversion sections 11G, 11B, and 11R. In such a case, for example, as illustrated in FIG. 13, it is possible to increase pixel rows that are simultaneously readable. This allows data to be read out at high speed.

Figure 14:
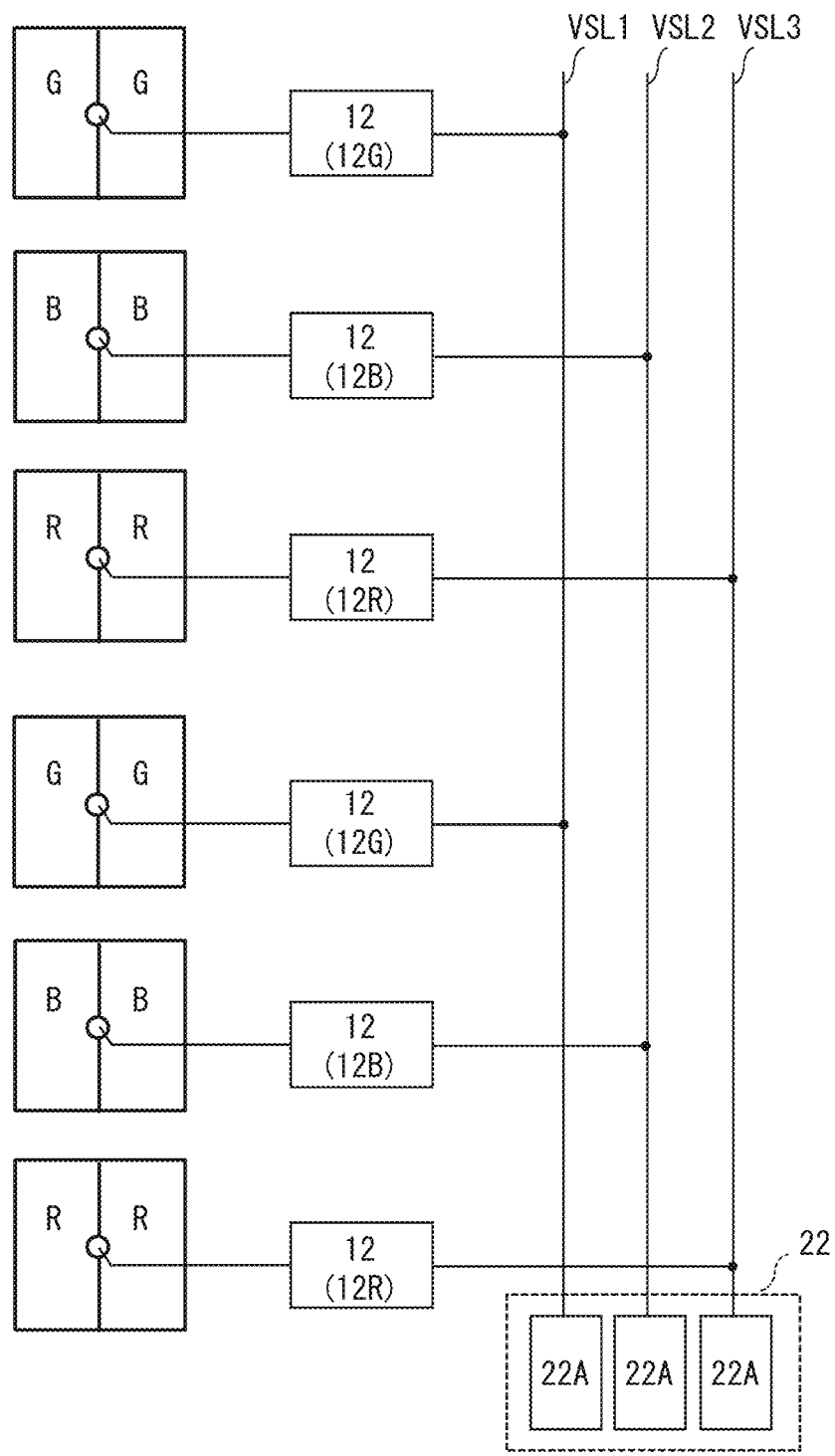
FIG. 14 is a diagram illustrating a modification example of the circuit configuration in FIG. 10.

In addition, in the present modification example, for example, as illustrated in FIG. 14, the plurality of pixel circuits 12G may be each provided for the two photoelectric conversion sections 11G. Similarly, for example, as illustrated in FIG. 14, the plurality of pixel circuits 12B may be each provided for the two photoelectric conversion sections 11B. Similarly, for example, as illustrated in FIG. 14, the plurality of pixel circuits 12R may be each provided for the two photoelectric conversion sections 11R. Even in such a case, it is possible to read out data at higher speed than in a case where one data output line is provided for each predetermined unit pixel column.

Figure 15:
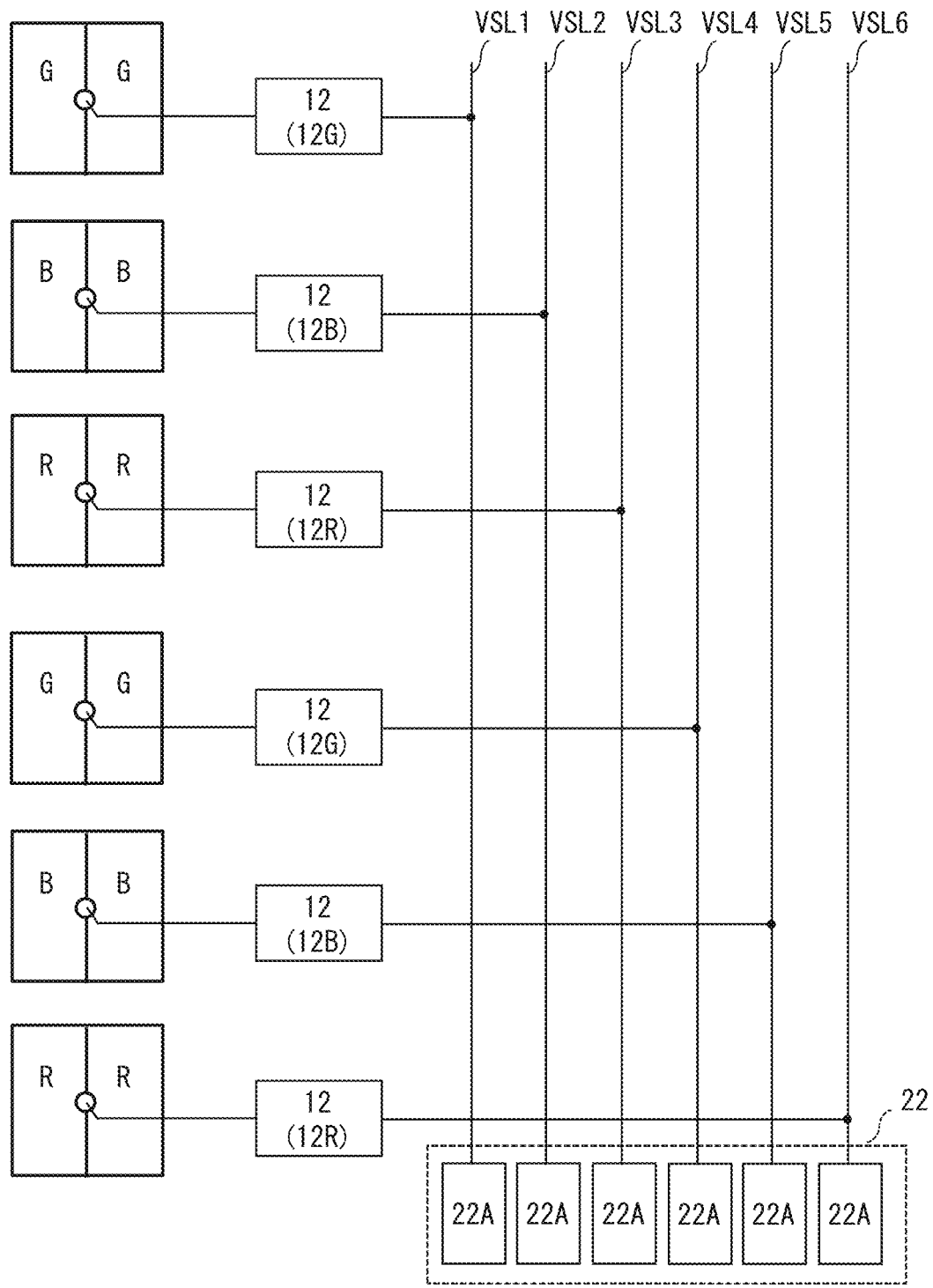
FIG. 15 is a diagram illustrating a modification example of the circuit configuration in FIG. 14.

In addition, in the present modification example, for example, as illustrated in FIG. 15, the six data output lines VSL may be provided to the solid-state imaging device 1 in each of unit pixel columns. Here, the six data output lines VSL correspond to the double of stacked layers in number. This means that the two data output lines VSL are provided for each of the wavelength selectivity types of the photoelectric conversion sections 11G, 11B, and 11R. In such a case, it is possible to increase pixel rows that are simultaneously readable. This allows data to be read out at high speed.

Figure 16:
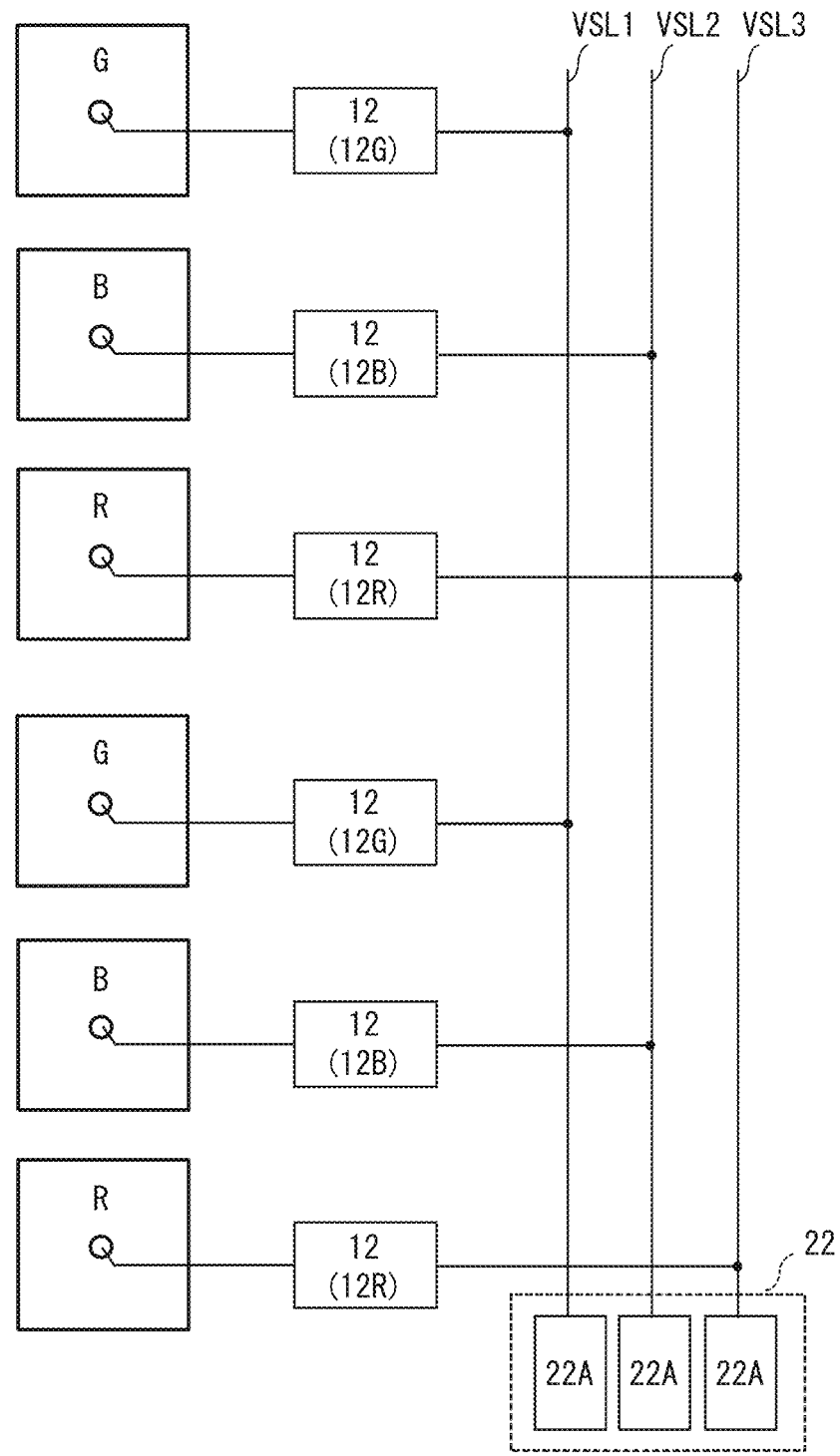
FIG. 16 is a diagram illustrating a modification example of the circuit configuration in FIG. 10.

In addition, in the present modification example, for example, as illustrated in FIG. 16, the plurality of pixel circuits 12G may be each provided for the one photoelectric conversion section 11G. Similarly, for example, as illustrated in FIG. 16, the plurality of pixel circuits 12B may be each provided for the one photoelectric conversion section 11B. Similarly, for example, as illustrated in FIG. 16, the plurality of pixel circuits 12R may be each provided for the one photoelectric conversion section 11R. Even in such a case, it is possible to read out data at higher speed than in a case where one data output line is provided for each predetermined unit pixel column.

Figure 17:
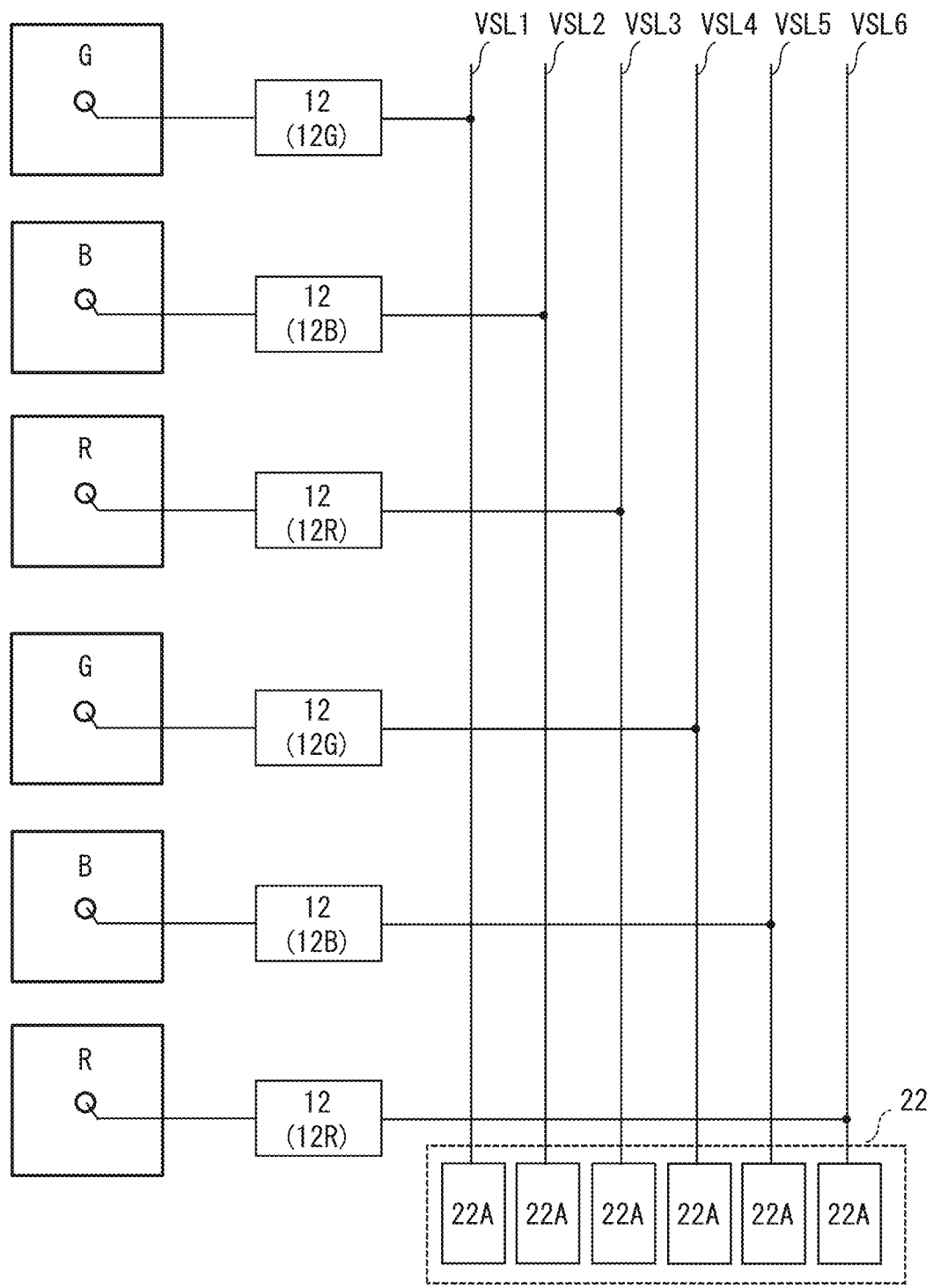
FIG. 17 is a diagram illustrating a modification example of the circuit configuration in FIG. 16.

In addition, in the present modification example, for example, as illustrated in FIG. 17, the six data output lines VSL may be provided to the solid-state imaging device 1 in each of unit pixel columns. Here, the six data output lines VSL correspond to the double of stacked layers in number. This means that the two data output lines VSL are provided for each of the wavelength selectivity types of the photoelectric conversion sections 11G, 11B, and 11R. In such a case, it is possible to increase pixel rows that are simultaneously readable. This allows data to be read out at high speed.

Modification Example B

Figure 18:
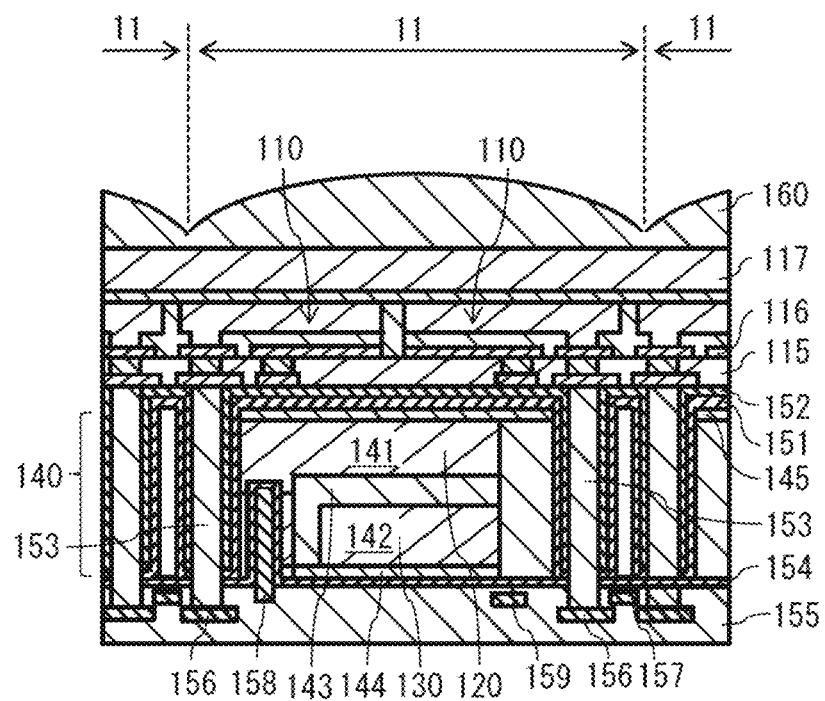
FIG. 18 is a diagram illustrating a modification example of the cross-sectional configuration of the pixel in FIG. 1.

FIG. 18 illustrates a modification example of a cross-sectional configuration of the pixel 11 in the solid-state imaging device 1 according to the above-described embodiment and modification example thereof. In the above-described embodiment and modification example thereof, each of the pixels 11 is provided the only one photoelectric conversion element 110 (photoelectric conversion section 11G). For example, as illustrated in FIG. 18, each of the pixels 11 may be, however, provided with the two photoelectric conversion elements 110 (photoelectric conversion sections 11G). In this case, it is also possible to consider that one photoelectric conversion element on the semiconductor substrate 140 includes the two photoelectric conversion elements 110 (photoelectric conversion sections 11G) in each of the pixels 11. In each of the pixels 11, the two photoelectric conversion elements 110 (photoelectric conversion sections 11G) are disposed in the same plane parallel with the light receiving surface. In this case, it is possible to obtain an image (phase difference image) for AF (autofocus) by using pixel signals obtained from the two photoelectric conversion elements 110 (photoelectric conversion sections 11G) provided to each of the pixels 11.

Figure 19:
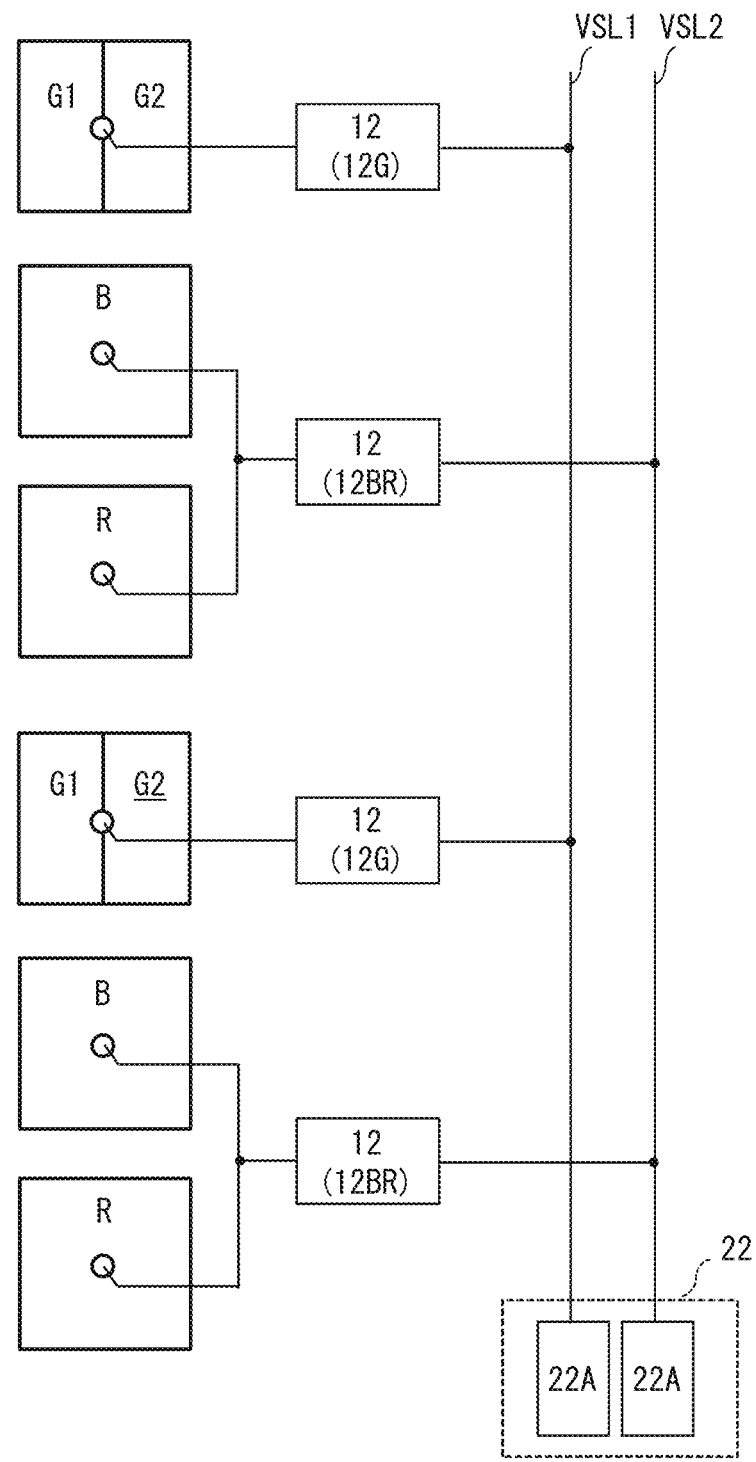
FIG. 19 is a diagram illustrating an example of a circuit configuration of a pixel and a component therearound in the solid-state imaging device having the cross-sectional configuration in FIG. 18.

FIG. 19 illustrates an example of a circuit configuration of a pixel and a component therearound in the solid-state imaging device 1 having the cross-sectional configuration in FIG. 18. In the present modification example, the plurality of pixel circuits 12G is each provided for the two photoelectric conversion sections 11G included in each of the pixels 11. Further, the plurality of pixel circuits 12BR is each provided to the one photoelectric conversion section 11B and the one photoelectric conversion section 11R each having predetermined wavelength selectivity. The plurality of respective pixel circuits 12BR is provided to groups obtained by dividing the plurality of photoelectric conversion sections 11B and 11R provided to the solid-state imaging device 1 into a plurality of groups. The respective groups include the same number of photoelectric conversion sections 11B. Similarly, the respective groups include the same number of photoelectric conversion sections 11R.

Here, the two drive wiring lines VOA are provided for each of pixel columns. In each of pixel rows, one of the drive wiring lines VOA is coupled to one of the photoelectric conversion sections 11G (specifically, electrodes 111) in each of the pixels 11 and the other drive wiring line VOA is coupled to the other photoelectric conversion section 11G (specifically, electrode 111) in each of the pixels 11.

In addition, in the plurality of photoelectric conversion sections 11B and 11R, a group is set for the one photoelectric conversion section 11B and the one photoelectric conversion section 11R that share the one floating diffusion FD. The one photoelectric conversion section 11B and the one photoelectric conversion section 11R that share the one floating diffusion FD thus form one group.

In the present modification example, the two data output lines VSL are provided to the solid-state imaging device 1 for each of unit pixel columns (i.e., pixel columns) corresponding to the pixels 11. One (VSL1) of the data output lines VSL is then coupled to each of the pixel circuits 12G and the other data output line VSL (VSL2) is coupled to the pixel circuit 12BR in each of pixel columns. The two photoelectric conversion sections 11G, the photoelectric conversion section 11B, and the photoelectric conversion section 11R included in the respective pixels 11 are disposed at positions directly opposed to each other in the thickness direction of the pixel region 10.

[Readout Operation]

Figure 20:
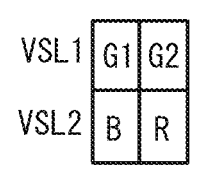

FIG. 20 illustrates an example of data output in the solid-state imaging device 1 having the circuit configuration illustrated in FIG. 19.

The vertical drive circuit 21 performs an operation of reading out electric charges from the photoelectric conversion sections 11G, 11B, and 11R by performing the series of readout operations mentioned in the above-described embodiment. For example, as illustrated in FIGS. 19 and 20, the vertical drive circuit 21 simultaneously performs readout operations on the one photoelectric conversion section 11G (one of the two photoelectric conversion sections 11G included in the pixel 11) at the first address and the one photoelectric conversion section 11B at the second address (or group Group7). This causes the electric charge of the one photoelectric conversion section 11G (one of the two photoelectric conversion sections 11G included in the pixel 11) at the first address to be read out to the column signal processing circuit 22 via the data output line VSL1 and simultaneously causes the electric charge of the one photoelectric conversion section 11B at the second address to be read to the column signal processing circuit 22 via the data output line VSL2.

Next, for example, as illustrated in FIGS. 19 and 20, the vertical drive circuit 21 simultaneously performs readout operations on the one unread photoelectric conversion section 11G (the other of the two photoelectric conversion sections 11G included in the pixel 11) at the first address and the one photoelectric conversion section 11R at the second address (or group Group7). This causes the electric charge of the one unread photoelectric conversion section 11G (the other of the two photoelectric conversion sections 11G included in the pixel 11) at the first address to be read out to the column signal processing circuit 22 via the data output line VSL1 and simultaneously causes the electric charge of the one photoelectric conversion section 11R at the second address to be read to the column signal processing circuit 22 via the data output line VSL2. The readout operations from the respective photoelectric conversion sections at the first address and the second address are completed in this way. Afterward, the vertical drive circuit 21 repeatedly performs readout operations from the respective photoelectric conversion sections in a similar method. The readout operation from each of the photoelectric conversion sections is completed in this way.

[Effects]

Next, effects of the solid-state imaging device 1 according to the present modification example are described.

In the present modification example, the two data output lines VSL are provided for each of pixel columns. In each of pixel columns, the data output line VSL1 that is one of the data output lines is coupled to each of the pixel circuits 12G and the other data output line VSL2 is coupled to each of the pixel circuits 12BR. Further, in this solid-state imaging device 1, each of the pixels 11 is provided with the two photoelectric conversion sections 11G. This makes it possible to read out, for example, while reading out pieces of data from the two photoelectric conversion sections 11G, pieces of data from the other photoelectric conversion sections 11B and 11R. As a result, there is no need to separately make time to obtain phase difference data for autofocus. It is thus possible to achieve higher data readout efficiency than in a case where time is separately made to obtain phase difference data for autofocus.

In addition, in the present modification example, the two drive wiring lines VOA are provided for each of pixel columns. Further, in each of pixel columns, one of the drive wiring lines VOA is coupled to one of the photoelectric conversion sections 11G in the pixel 11 and the other drive wiring line VOA is coupled to the other photoelectric conversion section 11G in the pixel 11. This makes it possible to read out, for example, while reading out pieces of data from the two photoelectric conversion sections 11G, pieces of data from the other photoelectric conversion sections 11B and 11R. As a result, there is no need to separately make time to obtain phase difference data for autofocus. It is thus possible to achieve higher data readout efficiency than in a case where time is separately made to obtain phase difference data for autofocus.

In addition, in the present modification example, in a case where each of the photoelectric conversion sections 11G includes the photoelectric conversion layer 112 formed by using an organic material in each of stacked photoelectric converters, it is also possible to achieve a photoelectric conversion characteristic with a feature different from that of a semiconductor layer.

Modification Example C

Figure 21:
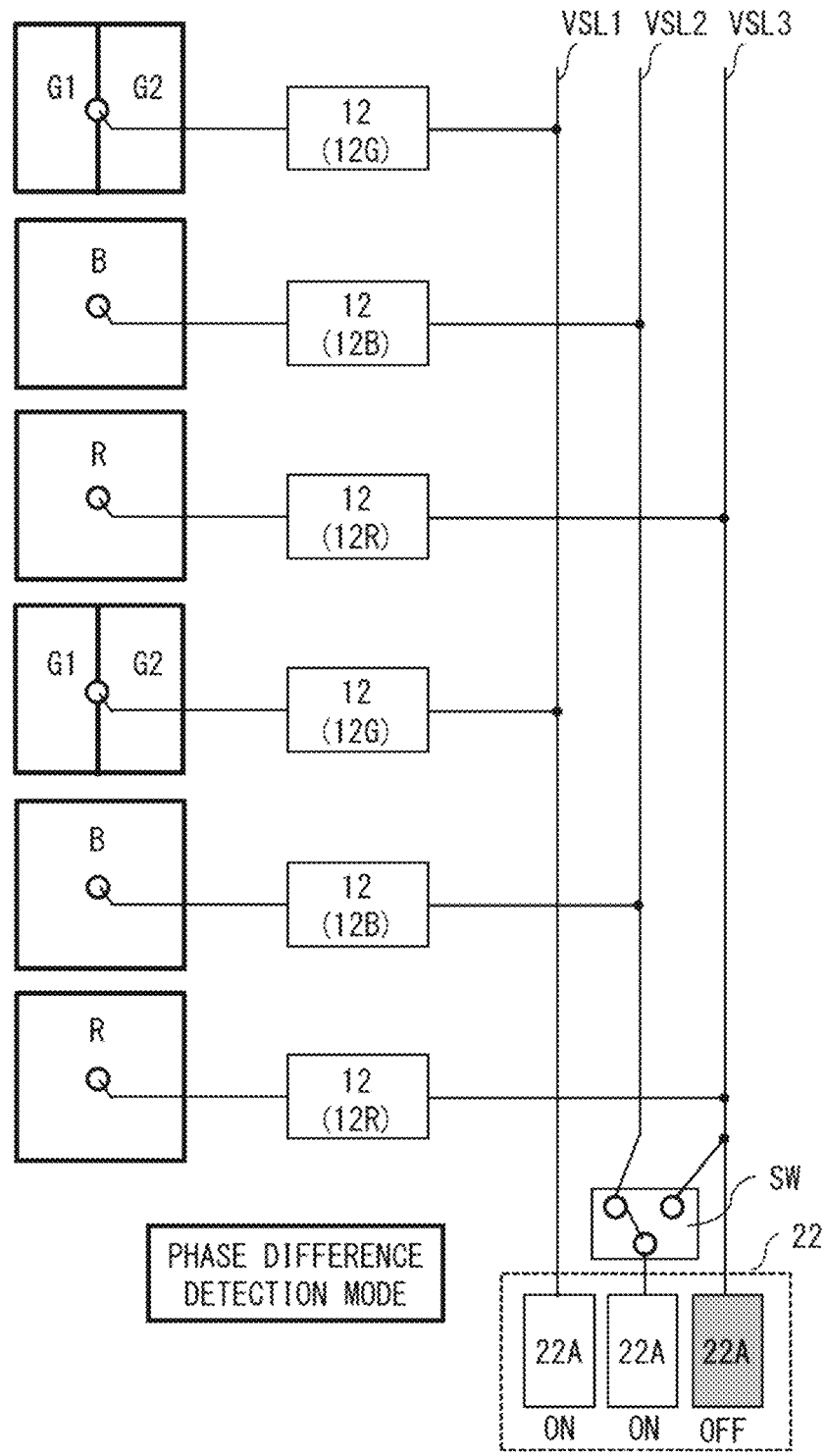
FIG. 21 is a diagram illustrating an example of a circuit configuration of a pixel and a component therearound in the solid-state imaging device having the cross-sectional configuration in FIG. 18.
Figure 22:
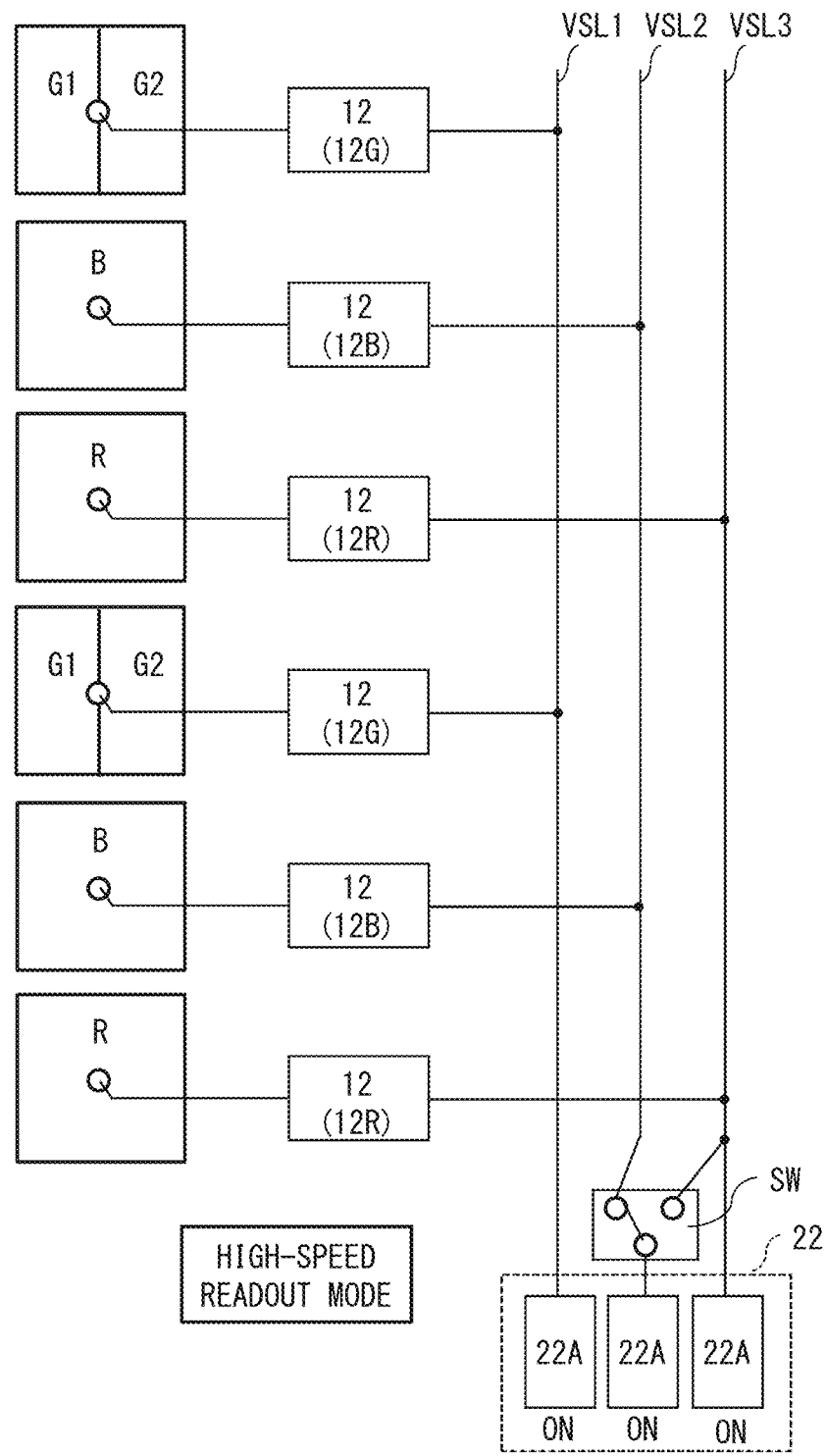
FIG. 22 is a diagram illustrating an example of the circuit configuration of the pixel and the component therearound in the solid-state imaging device having the cross-sectional configuration in FIG. 18.

FIGS. 21 and 22 each illustrate a modification example of a circuit configuration of the pixel 11 and a component therearound in the solid-state imaging device 1 according to the above-described modification example B. FIG. 21 illustrates a coupling mode in a case of a "phase difference detection mode". FIG. 22 illustrates a coupling mode in a case of a "high-speed readout mode". In the above-described modification example B, the logic circuit 20 may include a changeover switch SW that switches the coupling between any of two of the plurality of data output lines VSL and the column signal processing section 22A. The switch SW is coupled, for example, to the data output lines VSL2 and VSL3 and the column signal processing section 22A for the data output line VSL2.

The switch SW then electrically couples any of the data output lines VSL2 and VSL3 and the column signal processing section 22A for the data output line VSL2 under the control of the system control circuit 24. The system control circuit 24 outputs a control signal to the switch SW in a case of the "phase difference detection mode". The control signal is for alternately selecting the data output lines VSL2 and VSL3. The system control circuit 24 then turns off the power supply to the column signal processing section 22A for the data output line VSL3 and causes the column signal processing section 22A for the data output line VSL2 to read out pixel signals outputted to the data output lines VSL2 and VSL3. The system control circuit 24 outputs a control signal to the switch SW in a case of the "high-speed readout mode". The control signal is for selecting the data output line VSL2. The system control circuit 24 then turns on the power supply to the column signal processing section 22A for the data output line VSL3.

[Readout Operation]

FIG. 23 illustrates an example of data output in the solid-state imaging device 1 having the circuit configuration illustrated in FIG. 21. FIG. 23 illustrates an example of data output in a case of the "phase difference detection mode".

(Phase Difference Detection Mode)

The vertical drive circuit 21 performs an operation of reading out electric charges from the photoelectric conversion sections 11G, 11B, and 11R by combining the readout operations mentioned in the above-described embodiment. For example, as illustrated in FIGS. 21 and 23, the vertical drive circuit 21 simultaneously performs readout operations on the one photoelectric conversion section 11G (one of the two photoelectric conversion sections 11G included in the pixel 11) at the first address and the one photoelectric conversion section 11B at the first address. The system control circuit 24 then outputs a control signal for selecting the data output line VSL2 to the switch SW and turns off the power supply to the column signal processing section 22A for the data output line VSL3. This causes the electric charge of the one photoelectric conversion section 11G (one of the two photoelectric conversion sections 11G included in the pixel 11) at the first address to be read out to the column signal processing circuit 22 via the data output line VSL1 and simultaneously causes the electric charge of the one photoelectric conversion section 11B at the first address to be read to the column signal processing circuit 22 via the data output line VSL2.

Next, for example, as illustrated in FIGS. 21 and 23, the vertical drive circuit 21 simultaneously performs readout operations on the one unread photoelectric conversion section 11G (the other of the two photoelectric conversion sections 11G included in the pixel 11) at the first address and the one photoelectric conversion section 11R at the first address. The system control circuit 24 then outputs a control signal for selecting the data output line VSL3 to the switch SW and turns off the power supply to the column signal processing section 22A for the data output line VSL3. This causes the electric charge of the one unread photoelectric conversion section 11G (the other of the two photoelectric conversion sections 11G included in the pixel 11) at the first address to be read out to the column signal processing circuit 22 via the data output line VSL1 and simultaneously causes the electric charge of the one photoelectric conversion section 11R at the first address to be read to the column signal processing circuit 22 via the data output line VSL3 and the switch SW. The readout operation from each of the photoelectric conversion sections at the first address is completed in this way. Afterward, the vertical drive circuit 21 repeatedly performs readout operations from the respective photoelectric conversion sections in a similar method. The readout operation from each of the photoelectric conversion sections is completed in this way.

FIG. 24 illustrates an example of data output in the solid-state imaging device 1 having the circuit configuration illustrated in FIG. 21. FIG. 24 illustrates an example of data output in a case of the "high-speed readout mode".

(High-Speed Readout Mode)

The vertical drive circuit 21 performs an operation of reading out electric charges from the photoelectric conversion sections 11G, 11B, and 11R by performing the series of readout operations mentioned in the above-described embodiment. For example, as illustrated in FIGS. 22 and 24, the vertical drive circuit 21 simultaneously performs readout operations on the one photoelectric conversion section 11G (one of the two photoelectric conversion sections 11G included in the pixel 11) at the first address and the one photoelectric conversion section 11B and the one photoelectric conversion section 11R at the first address. The system control circuit 24 then outputs a control signal for selecting the data output line VSL2 to the switch SW and turns on the power supply to the column signal processing section 22A for the data output line VSL3. This causes the electric charge of the one photoelectric conversion section 11B (one of the two photoelectric conversion sections 11G included in the pixel 11) at the first address to be read out to the column signal processing circuit 22 via the data output line VSL1, causes the electric charge of the one photoelectric conversion section 11B at the first address to be read out to the column signal processing circuit 22 via the data output line VSL2, and causes the electric charge of the one photoelectric conversion section 11R at the first address to be read out to the column signal processing circuit 22 via the data output line VSL3. Afterward, the vertical drive circuit 21 and the system control circuit 24 repeatedly perform readout operations simultaneously on the respective photoelectric conversion sections in a similar method. The readout operation from each of the photoelectric conversion sections is completed in this way.

[Effects]

Next, effects of the solid-state imaging device 1 according to the present modification example are described.

In the present modification example, the changeover switch SW is provided that switches the coupling between any of two of the plurality of data output lines VSL and the column signal processing section 22A. This makes it possible to read out phase difference data for autofocus at high data readout efficiency while suppressing power consumption in the column signal processing circuit 22.

Modification Example D

FIG. 25 illustrates a modification example of a cross-sectional configuration of the pixel 11 in the solid-state imaging device 1 according to the above-described embodiment and modification examples thereof. In the above-described embodiment and modification examples thereof, the photoelectric conversion element 120 is provided in the semiconductor substrate 140. In the above-described embodiment and modification examples thereof, the photoelectric conversion element 120 may be, however, provided above the semiconductor substrate 140. The photoelectric conversion element 120 may be provided above the photoelectric conversion element 110, for example, as illustrated in FIG. 25.

The photoelectric conversion elements 110, 120, and 130 are disposed in the vertical direction in the order of the photoelectric conversion element 120, the photoelectric conversion element 110, and the photoelectric conversion element 130 from the light incidence direction (on-chip lens 160 side). This is because light having a shorter wavelength is more efficiently absorbed on the incidence surface side. It is to be noted that the photoelectric conversion elements 110, 120, and 130 may also be disposed in the vertical direction in the order of the photoelectric conversion element 110, the photoelectric conversion element 120, and the photoelectric conversion element 130 from the light incidence direction (on-chip lens 160 side).

In the present modification example, the photoelectric conversion element 120 is formed, for example, in insulating layers (protective layer 117, insulating layer 125, and protective layer 126) on the photoelectric conversion element 110. For example, the photoelectric conversion element 120 includes an electrode 121, a photoelectric conversion layer 122, and an electrode 123 stacked in this order from the semiconductor substrate 140 side.

The photoelectric conversion element 120 further includes, for example, an electric charge accumulating electrode 124 in the same layer as the electrode 121. The electric charge accumulating electrode 124 is disposed apart from the electrode 121. The electric charge accumulating electrode 124 is disposed to be opposed to the photoelectric conversion layer 122 with the insulating layer 125 interposed therebetween. The electrode 121 and the electric charge accumulating electrode 124 are covered with the protective layer 117 and the insulating layer 125. The electrode 121 is in contact with the photoelectric conversion layer 122 via an opening of the insulating layer 125. The electrode 123 is a solid film formed in contact with surfaces of the photoelectric conversion layer 122 and the insulating layer 125. The electrode 123 includes, for example, the same layer as that of the electrode 123 of the adjacent pixel 11.

The photoelectric conversion element 120 includes, for example, the photoelectric conversion layer 122 that absorbs blue light (light in a wavelength range of 425 nm or more and 495 nm or less) and has sensitivity to blue light. The photoelectric conversion layer 122 includes, for example, an organic material that absorbs blue light. Examples of such an organic material include a coumaric acid dye, tris-8-hydroxyquinoline aluminum (Alq3), a merocyanine-based dye, and the like. It is to be noted that the photoelectric conversion layer 122 may include a material different from the organic material. The protective layer 117, the insulating layer 125, and the protective layer 126 each include, for example, $SiO_2$, SiN, or the like. The electrodes 121 and 123 each include, for example, a transparent electrically conductive material. Examples of the transparent electrically conductive material include ITO, IZO, and the like. It is to be noted that the photoelectric conversion layer 122 is not limited to an organic material, but may include, for example, an inorganic material. Examples of such an inorganic material include silicon, selenium, amorphous selenium, a chalcopyrite-based compound, a III-V group compound, and a compound semiconductor (e.g., CdSe, CdS, ZnSe, ZnS, PbSe, PbS, and the like). The photoelectric conversion layer 122 may include a quantum dot including the above-described inorganic material.

The photoelectric conversion element 120 is coupled, for example, to a wiring line 163 via a contact hole 162 or the like provided to the semiconductor substrate 140. The wiring line 163 is provided to the back surface of the semiconductor substrate 140. The wiring line 163 electrically couples the electrode 121 of the photoelectric conversion element 120 and the pixel circuit 12 (e.g., gate electrode 164 of an amplification transistor in the pixel circuit 12) for the photoelectric conversion element 120.

In the present modification example, the photoelectric conversion element 130 includes, for example, an n-type semiconductor region 161 as a photoelectric conversion layer. The n-type semiconductor region 161 is formed in the semiconductor substrate 140. The photoelectric conversion element 130 includes, for example, the n-type semiconductor region 161 that absorbs red light (light in a wavelength range of 620 nm or more and 750 nm or less) and has sensitivity to red light. The photoelectric conversion element 130 is coupled, for example, to a wiring line via the transfer transistor TR provided to the semiconductor substrate 140. The wiring line is provided to the back surface of the semiconductor substrate 140. This wiring line electrically couples the n-type semiconductor region 161 and the pixel circuit 12 (e.g., gate electrode 165 of an amplification transistor in the pixel circuit 12) for the photoelectric conversion element 130.

The semiconductor substrate 140 includes the p+ layer 145 between the n-type semiconductor region 161 and the front surface of the semiconductor substrate 140. The semiconductor substrate 140 includes the p+ layer 144 near the back surface of the semiconductor substrate 140. The back surface of the semiconductor substrate 140 is provided with the insulating film 154 and the HfO$_2$ film 151 and the insulating film 152 are stacked on the front surface of the semiconductor substrate 140. The HfO$_2$ film 151 is a film having a negative fixed charge and providing such a film allows the generation of dark currents to be suppressed. For example, a wiring line that electrically couples the photoelectric conversion elements 110, 120, and 130 and the pixel circuit 12 to each other and the insulating layer 155 that covers the pixel circuit 12 and the like are formed on the back surface of the semiconductor substrate 140.

Next, the readout of an electric charge from the photoelectric conversion element 120 (photoelectric conversion section 11B) is described.

The vertical drive circuit 21 applies the potential $V_{11}$ to the electrode 121 and applies the potential $V_{12}$ ($V_{12}>V_{11}$) to the electric charge accumulating electrode 124 in the electric charge accumulation period. Light incident on the photoelectric conversion layer 122 is then photoelectrically converted in the photoelectric conversion layer 122 and the holes generated by this are transmitted from the electrode 123 to the vertical drive circuit 21 via the drive wiring line VOU. The vertical drive circuit 21 further applies a positive potential to the electrode 121 and applies a negative potential to the electrode 123. This causes the electrons generated through photoelectric conversion to be attracted to the electric charge accumulating electrode 124 and stay near the electric charge accumulating electrode 124 of the photoelectric conversion layer 122. That is, the electric charges are stored in the photoelectric conversion layer 122. It is to be noted that the electrons generated inside the photoelectric conversion layer 122 do not move toward the electrode 121 because $V_{12}>V_{11}$. The potential near the electric charge accumulating electrode 124 of the photoelectric conversion layer 122 has a more negative value with the elapsed time of photoelectric conversion.

The vertical drive circuit 21 performs a reset operation in the latter half of the electric charge accumulation period. This resets the potential of the floating diffusion FD and the potential of the floating diffusion FD is equal to the potential of the power supply line VDD.

The vertical drive circuit 21 reads out an electric charge after the reset operation is completed. That is, the vertical drive circuit 21 applies the potential $V_{21}$ to the electrode 121 and applies the potential $V_{22}$ ($V_{22}>V_{21}$) to the electric charge accumulating electrode 124 in the electric charge transfer period. This causes the electrons staying near the electric charge accumulating electrode 124 of the photoelectric conversion layer 122 to be read out to the electrode 121 and further to the floating diffusion FD. That is, the electric charges accumulated in the photoelectric conversion layer 122 are read out to the column signal processing circuit 22. The readout of electric charges from the photoelectric conversion element 120 (photoelectric conversion section 11B) is completed by performing a series of operations such as accumulating electric charges, performing a reset operation, and transferring electric charges in this way.

In the present modification example, the two photoelectric conversion elements 120 and 130 are provided above the semiconductor substrate 140. Even in such a case, it is possible to attain an effect similar to that of the above-described embodiment.

Modification Example E

FIG. 26 illustrates a modification example of a cross-sectional configuration of the pixel 11 in the solid-state imaging device 1 according to the above-described embodiment and modification examples thereof. In the present modification example, all of the three photoelectric conversion elements 110, 120, and 130 are provided above the semiconductor substrate 140. That is, the solid-state imaging device 1 according to the present modification example corresponds to a device in which the photoelectric conversion element 130 is provided above the semiconductor substrate 140 in the solid-state imaging device 1 according to the above-described modification example D.

The photoelectric conversion elements 110, 120, and 130 are disposed in the vertical direction in the order of the photoelectric conversion element 120, the photoelectric conversion element 110, and the photoelectric conversion element 130 from the light incidence direction (on-chip lens 160 side). This is because light having a shorter wavelength is more efficiently absorbed on the incidence surface side. It is to be noted that the photoelectric conversion elements 110, 120, and 130 may also be disposed in the vertical direction in the order of the photoelectric conversion element 110, the photoelectric conversion element 120, and the photoelectric conversion element 130 from the light incidence direction (on-chip lens 160 side).

In the present modification example, the photoelectric conversion element 130 is formed, for example, in insulating layers (insulating layers 127, 128, and 115) between the front surface of the semiconductor substrate 40 and the photoelectric conversion element 110. For example, the photoelectric conversion element 130 includes an electrode 131, a photoelectric conversion layer 132, and an electrode 133 stacked in this order from the semiconductor substrate 140 side.

The photoelectric conversion element 130 further includes, for example, an electric charge accumulating electrode 134 in the same layer as the electrode 131. The electric charge accumulating electrode 134 is disposed apart from the electrode 131. The electric charge accumulating electrode 134 is disposed to be opposed to the photoelectric conversion layer 132 with the insulating layer 128 interposed therebetween. The electrode 131 and the electric charge accumulating electrode 134 are covered with the insulating layers 127 and 128. The electrode 131 is in contact with the photoelectric conversion layer 132 via an opening of the insulating layer 128. The electrode 133 is a solid film formed in contact with surfaces of the photoelectric conversion layer 132 and the insulating layer 125. The electrode 133 includes, for example, the same layer as that of the electrode 133 of the adjacent pixel 11.

The photoelectric conversion element 130 includes, for example, the photoelectric conversion layer 132 that absorbs red light (light in a wavelength range of 620 nm or more and 750 nm or less) and has sensitivity to red light. The photoelectric conversion layer 132 includes, for example, an organic material that absorbs red light. Examples of such an organic material include a phthalocyanine-based dye, a subphthalocyanine dye (subphthalocyanine derivative) dye, and the like. It is to be noted that the photoelectric conversion layer 132 may include a material different from the organic material. The insulating layers 127 and 128 each include, for example, SiO$_2$, SiN, or the like. The electrodes 13 and 133 each include, for example, a transparent electrically conductive material. Examples of the transparent electrically conductive material include ITO, IZO, and the like. It is to be noted that the photoelectric conversion layer 132 is not limited to an organic material, but may include, for example, an inorganic material. Examples of such an inorganic material include silicon, selenium, amorphous selenium, a chalcopyrite-based compound, a III-V group compound, and a compound semiconductor (e.g., CdSe, CdS, ZnSe, ZnS, PbSe, PbS, and the like). The photoelectric conversion layer 132 may include a quantum dot including the above-described inorganic material.

The photoelectric conversion element 130 is coupled, for example, to a wiring line 167 via a contact hole 166 or the like provided to the semiconductor substrate 140. The wiring line 167 is provided to the back surface of the semiconductor substrate 140. The wiring line 167 electrically couples the electrode 131 of the photoelectric conversion element 130 and the pixel circuit 12 (e.g., gate electrode 168 of an amplification transistor in the pixel circuit 12) for the photoelectric conversion element 130.

Next, the readout of an electric charge from the photoelectric conversion element 130 (photoelectric conversion section 11R) is described.

The vertical drive circuit 21 applies the potential $V_{11}$ to the electrode 131 and applies the potential $V_{12}$ ($V_{12} > V_{11}$) to the electric charge accumulating electrode 134 in the electric charge accumulation period. Light incident on the photoelectric conversion layer 132 is then photoelectrically converted in the photoelectric conversion layer 132 and the holes generated by this are transmitted from the electrode 133 to the vertical drive circuit 21 via the drive wiring line VOU. The vertical drive circuit 21 further applies a positive potential to the electrode 131 and applies a negative potential to the electrode 133. This causes the electrons generated through photoelectric conversion to be attracted to the electric charge accumulating electrode 134 and stay near the electric charge accumulating electrode 134 of the photoelectric conversion layer 132. That is, the electric charges are stored in the photoelectric conversion layer 132. It is to be noted that the electrons generated inside the photoelectric conversion layer 132 do not move toward the electrode 131 because $V_{12} > V_{11}$. The potential near the electric charge accumulating electrode 134 of the photoelectric conversion layer 132 has a more negative value with the elapsed time of photoelectric conversion.

The vertical drive circuit 21 performs a reset operation in the latter half of the electric charge accumulation period. This resets the potential of the floating diffusion FD and the potential of the floating diffusion FD is equal to the potential of the power supply line VDD.

The vertical drive circuit 21 reads out an electric charge after the reset operation is completed. That is, the vertical drive circuit 21 applies the potential $V_{21}$ to the electrode 131 and applies the potential $V_{22}$ ($V_{22} > V_{11}$) to the electric charge accumulating electrode 134 in the electric charge transfer period. This causes the electrons staying near the electric charge accumulating electrode 134 of the photoelectric conversion layer 132 to be read out to the electrode 131 and further to the floating diffusion FD. That is, the electric charges accumulated in the photoelectric conversion layer 132 are read out to the column signal processing circuit 22. The readout of electric charges from the photoelectric conversion section 11R is completed by performing a series of operations such as accumulating electric charges, performing a reset operation, and transferring electric charges in this way.

In the present modification example, all of the three photoelectric conversion elements 110, 120, and 130 are provided above the semiconductor substrate 140. Even in such a case, it is possible to attain an effect similar to that of the above-described embodiment.

3. Second Embodiment

[Configuration]

Figure 27:
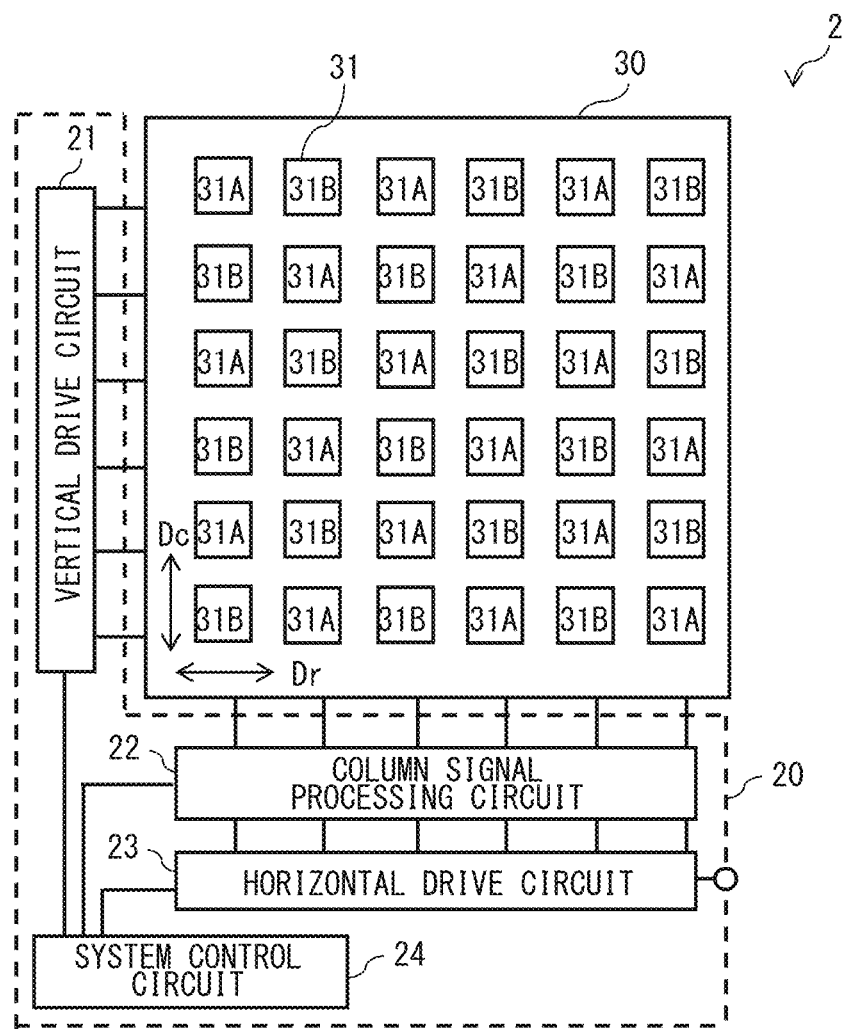
FIG. 27 is a diagram illustrating an example of a circuit configuration of a pixel and a component therearound in the solid-state imaging device having the cross-sectional configuration in FIG. 26.
Figure 28:
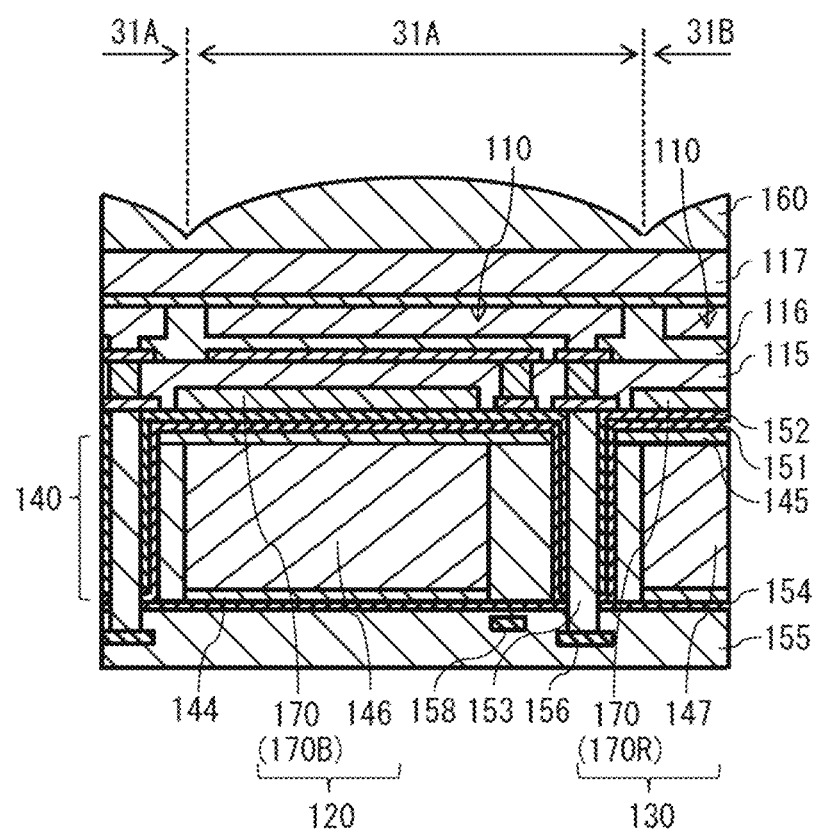
FIG. 28 is a diagram illustrating an example of data output in the solid-state imaging device having the circuit configuration in FIG. 27.
Figure 29:
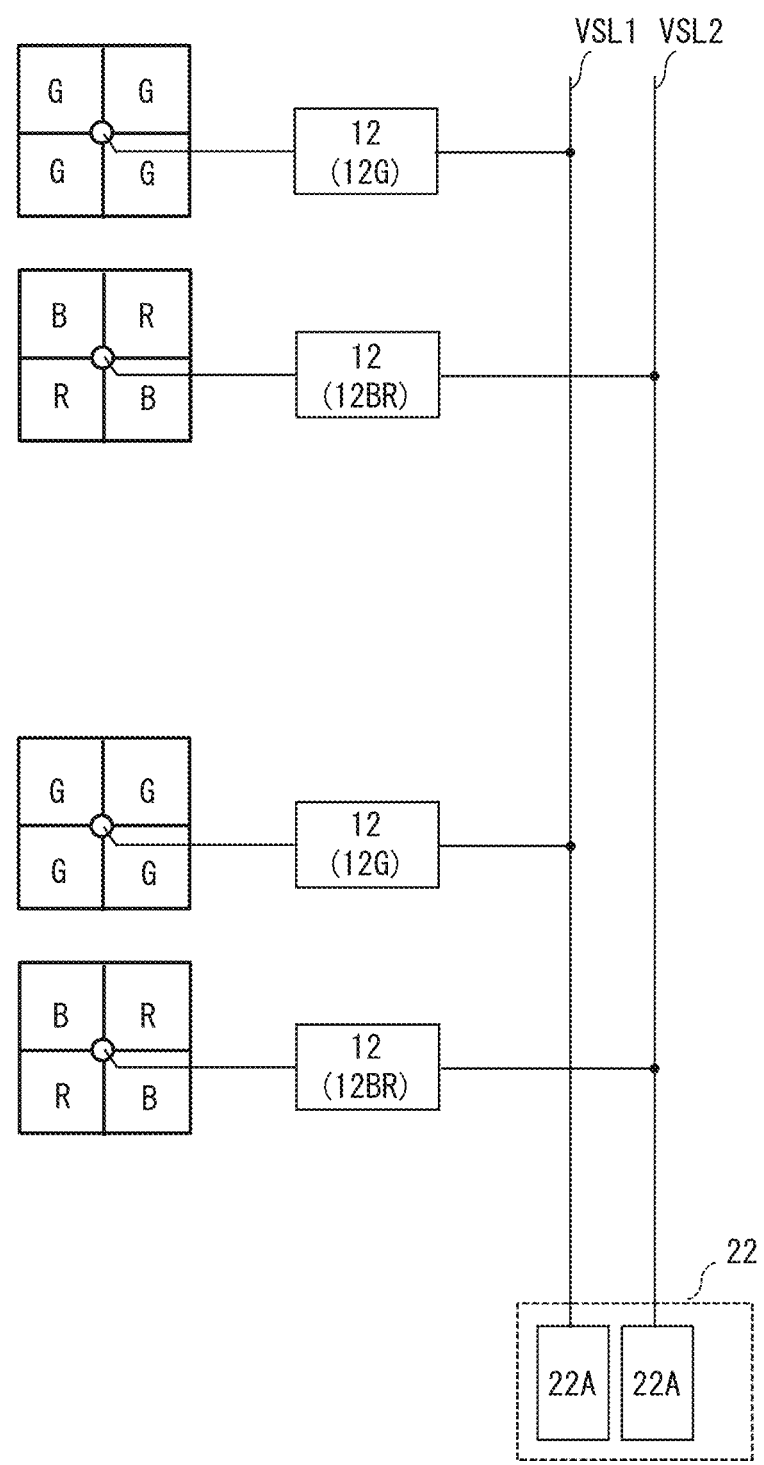
FIG. 29 is a diagram illustrating a modification example of the cross-sectional configuration of the pixel in FIG. 1.

FIG. 27 illustrates an example of a schematic configuration of a solid-state imaging device 2 according to a second embodiment of the present disclosure. The solid-state imaging device 2 includes a pixel region 30. In the pixel region 30, a plurality of pixels 31 are disposed in a matrix. FIG. 28 illustrates an example of a cross-sectional configuration of the pixel 31. FIG. 29 illustrates an example of a circuit configuration of the pixel 31 and a component therearound. FIG. 29 illustrates a circuit configuration in a "predetermined unit pixel column". In a case where the one pixel circuit 12 shares the plurality of pixels 31 and the plurality of pixels 31 sharing the pixel circuit 12 has a layout of m pixel rows×two pixel columns (m represents an integer greater than 1), the "predetermined unit pixel column" refers to two pixel columns. Similarly, in a case where the plurality of pixels 31 sharing the pixel circuit 12 has a layout of m pixel rows×four pixel columns (m represents an integer greater than 1), the "predetermined unit pixel column" refers to four pixel columns.

The solid-state imaging device 2 includes the plurality of pixel circuits 12, the plurality of drive wiring lines VOA, and the plurality of data output lines VSL. The pixel circuit 12 outputs a pixel signal based on an electric charge outputted from the pixel 31. Each of the drive wiring lines VOA is a wiring line to which a control signal is applied. The control signal is for controlling the output of the electric charges accumulated in the pixel 31. The drive wiring line VOA extends, for example, in the row direction Dr. Each of the data output lines VSL is a wiring line for outputting a pixel signal outputted from each pixel circuit 12 to a logic circuit 20. The data output line VSL extends, for example, in the column direction Dc.

The solid-state imaging device 2 includes the logic circuit 20 that processes a pixel signal. The logic circuit 20 includes, for example, the vertical drive circuit 21, the column signal processing circuit 22, the horizontal drive circuit 23, and the system control circuit 24. The logic circuit 20 generates an output voltage on the basis of a pixel signal obtained from each of the pixels 31 and outputs the output voltage to the outside.

For example, the vertical drive circuit 21 selects the plurality of pixels 31 in order for each predetermined unit pixel row. The "predetermined unit pixel row" refers to a pixel row whose pixels are selectable by the same address. For example, in a case where the plurality of pixels 31 shares the one pixel circuit 12 and the plurality of pixels 31 sharing the pixel circuit 12 has a layout of two pixel rows×n pixel columns (n represents an integer greater than 1), the "predetermined unit pixel row" refers to two pixel rows. Similarly, in a case where the plurality of pixels 31 sharing the pixel circuit 12 has a layout of four pixel rows×n pixel columns (n represents an integer greater than 1), the "predetermined unit pixel row" refers to four pixel rows.

The column signal processing circuit 22 performs a correlated double sampling process, for example, on a pixel signal outputted from each of the pixels 31 in a row selected by the vertical drive circuit 21. The column signal processing circuit 22 extracts the signal level of the pixel signal, for example, by performing the CDS process and holds pixel data corresponding to the amount of received light of each of the pixels 31. The column signal processing circuit 22 includes, for example, the column signal processing section 22A for each of the data output lines VSL.

The plurality of pixels 31 provided to the pixel region 10 includes a plurality of pixels 31A and a plurality of pixels 31B. The pixels 31A each include a stacked photoelectric converter in which the two photoelectric conversion elements 110 and 120 each having different wavelength selectivity are stacked with a color filter 170 (170B) sandwiched therebetween. The plurality of pixels 31B each includes a stacked photoelectric converter in which the two photoelectric conversion elements 110 and 130 each having different wavelength selectivity are stacked with the color filter 170 (170R) sandwiched therebetween. That is, in each of the pixels 31, the stacked photoelectric converter includes the color filter 170. The pixel 31 further includes the on-chip lens 160 at a portion opposed to the above-described stacked photoelectric converter. That is, the solid-state imaging device 2 includes the on-chip lens 160 for each of the pixels 31.

The photoelectric conversion element 110 is formed, for example, in insulating layers (insulating layers 115 and 116 and protective layer 117) on the semiconductor substrate 140. The photoelectric conversion element 110 includes, for example, the photoelectric conversion layer 112 that absorbs green light (light in a wavelength range of 495 nm or more and 570 nm or less) and has sensitivity to green light. The photoelectric conversion layer 112 includes, for example, an organic material that absorbs green light. Examples of such an organic material include a rhodamine-based dye, a merocyanine-based dye, quinacridone, and the like. It is to be noted that the photoelectric conversion layer 112 may include a material different from the organic material.

The photoelectric conversion elements 120 and 130 are each formed, for example, in the semiconductor substrate 140. The photoelectric conversion element 120 includes, for example, an n-type semiconductor region 146 as a photoelectric conversion layer. The n-type semiconductor region 146 is formed in the semiconductor substrate 140. The photoelectric conversion element 120 includes the n-type semiconductor region 146 that absorbs incident light via the color filter 170B that selectively transmits, for example, blue light. The photoelectric conversion element 120 has sensitivity to the wavelength band including the light passing through the color filter 170B. The photoelectric conversion element 120 is coupled, for example, to a wiring line via the transfer transistor TR provided to the semiconductor substrate 140. The wiring line is provided to the back surface of the semiconductor substrate 140. This wiring line electrically couples the n-type semiconductor region 146 and the pixel circuit 12 for the photoelectric conversion element 120. It is to be noted that FIG. 28 exemplifies a gate electrode 158 of the transfer transistor TR electrically coupled to the photoelectric conversion element 120.

The photoelectric conversion element 130 includes, for example, an n-type semiconductor region 147 as a photoelectric conversion layer. The n-type semiconductor region 147 is formed in the semiconductor substrate 140. The photoelectric conversion element 130 includes the n-type semiconductor region 147 that absorbs incident light via the color filter 170R that selectively transmits, for example, red light. The photoelectric conversion element 130 has sensitivity to the wavelength band including the light passing through the color filter 170R. The n-type semiconductor region 147 may have the same configuration as that of the n-type semiconductor region 146 or a different configuration from that of the n-type semiconductor region 146. The photoelectric conversion element 130 is coupled, for example, to a wiring line via the transfer transistor TR provided to the semiconductor substrate 140. The wiring line is provided to the back surface of the semiconductor substrate 140. This wiring line electrically couples the n-type semiconductor region 147 and the pixel circuit 12 for the photoelectric conversion element 130.

The semiconductor substrate 140 includes the p+ layer 145 between the n-type semiconductor regions 146 and 147 and the front surface of the semiconductor substrate 140. The semiconductor substrate 140 includes the p+ layer 144 near the back surface of the semiconductor substrate 140. The back surface of the semiconductor substrate 140 is provided with the insulating film 154 and the HfO$_2$ film 151 and the insulating film 152 are stacked on the front surface of the semiconductor substrate 140. For example, a wiring line that electrically couples the photoelectric conversion elements 110, 120, and 130 and the pixel circuit 12 to each other and the insulating layer 155 that covers the pixel circuit 12 and the like are formed on the back surface of the semiconductor substrate 140.

The plurality of pixel circuits 12 provided to the solid-state imaging device 1 includes a plurality of pixel circuits 12G and a plurality of pixel circuits 12BR. The plurality of pixel circuits 12G is assigned to the photoelectric conversion sections 11G. The plurality of pixel circuits 12BR is assigned to the photoelectric conversion sections 11B and 11R. The pixel circuits 12G output pixel signals based on electric charges outputted from the photoelectric conversion sections 11G each having predetermined wavelength selectivity. The pixel circuits 12BR output pixel signals based on electric charges outputted from the photoelectric conversion sections 11B and 11R each having predetermined wavelength selectivity.

(Relationship Between Photoelectric Conversion Section 11G and Pixel Circuit 12G)

The plurality of pixel circuits 12G is each provided to the plurality of photoelectric conversion sections 11G having the same wavelength selectivity. The plurality of respective pixel circuits 12G is provided to groups obtained by dividing the plurality of photoelectric conversion sections 11G provided to the solid-state imaging device 2 into a plurality of groups. The respective groups include the same number of photoelectric conversion sections 11G.

Here, in the plurality of photoelectric conversion sections 11G, each group is set for the plurality of photoelectric conversion sections 11G sharing the floating diffusion FD. For example, in a case where the four photoelectric conversion sections 11G share the one floating diffusion FD, the four photoelectric conversion sections 11G sharing the floating diffusion FD form one group.

(Relationship Between Photoelectric Conversion Section 11BR and Pixel Circuit 12BR)

The plurality of pixel circuits 12BR is each provided to the plurality of photoelectric conversion sections 11B and 11R each having predetermined wavelength selectivity. The plurality of respective pixel circuits 12BR is provided to groups obtained by dividing the plurality of photoelectric conversion sections 11B and 11R provided to the solid-state imaging device 2 into a plurality of groups. The respective groups include the same number of photoelectric conversion sections 11B. Similarly, the respective groups include the same number of photoelectric conversion sections 11R.

Here, in the plurality of photoelectric conversion sections 11B and 11R, each group is set for the plurality of photoelectric conversion sections 11B and 11R sharing the floating diffusion FD. For example, in a case where the two photoelectric conversion sections 11B and the two photoelectric conversion sections 11R share the one floating diffusion FD, the two photoelectric conversion sections 11B and the two photoelectric conversion sections 11R that share the one floating diffusion FD form one group. The plurality of photoelectric conversion sections 11B and 11R is then alternately disposed in the direction parallel with each of unit pixel columns in the unit pixel column.

The plurality of data output lines VSL is provided for each of unit pixel columns. The plurality of data output lines VSL is equal in number to an integer multiple of the photoelectric conversion elements 110 and 120 or the photoelectric conversion elements 110 and 130 stacked in the stacked photoelectric converter. In the present embodiment, for example, as illustrated in FIG. 29, the two data output lines VSL (i.e., the same number of data output lines VSL as the number of stacked layers) are provided to the solid-state imaging device 2 in each of unit pixel columns. One (VSL1) of the data output lines VSL is coupled to the pixel circuit 12G and the other data output line VSL (VSL2) is coupled to the pixel circuit 12BR in each of pixel columns.

The plurality of photoelectric conversion sections 11G belonging to a predetermined group and the plurality of photoelectric conversion sections 11B and 11R belonging to a predetermined group may be disposed at the positions directly opposed to each other in the thickness direction of the pixel region 10 or disposed at the positions shifted by one pixel row or one pixel column from the positions directly opposed to each other in the thickness direction of the pixel region 10.

[Readout Operation]

Figure 30:
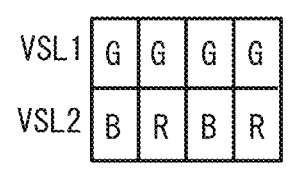

FIG. 30 illustrates an example of data output in the solid-state imaging device 2 having the circuit configuration illustrated in FIG. 29.

The vertical drive circuit 21 performs an operation of reading out electric charges from the photoelectric conversion sections 11G, 11B, and 11R by combining the readout operations mentioned in the above-described first embodiment. The vertical drive circuit 21 performs readout operations in series on the four photoelectric conversion sections 11R at the first address and the two photoelectric conversion sections 11R and the two photoelectric conversion sections 11B at the first address, for example, as illustrated in FIGS. 29 and 30. This causes the electric charges of the four photoelectric conversion sections 11R, the two photoelectric conversion sections 11R, and the two photoelectric conversion sections 11B at the first address to be read out in series to the column signal processing circuit 22 via the data output line VSL1. Afterward, the vertical drive circuit 21 repeatedly performs readout operations in a similar method in series on the four photoelectric conversion sections 11R, the two photoelectric conversion sections 11R, and the two photoelectric conversion sections 11B at the same address. The readout operation from each of the photoelectric conversion sections is completed in this way.

4. Modification Example of Second Embodiment

Modification Example F

Figure 31:
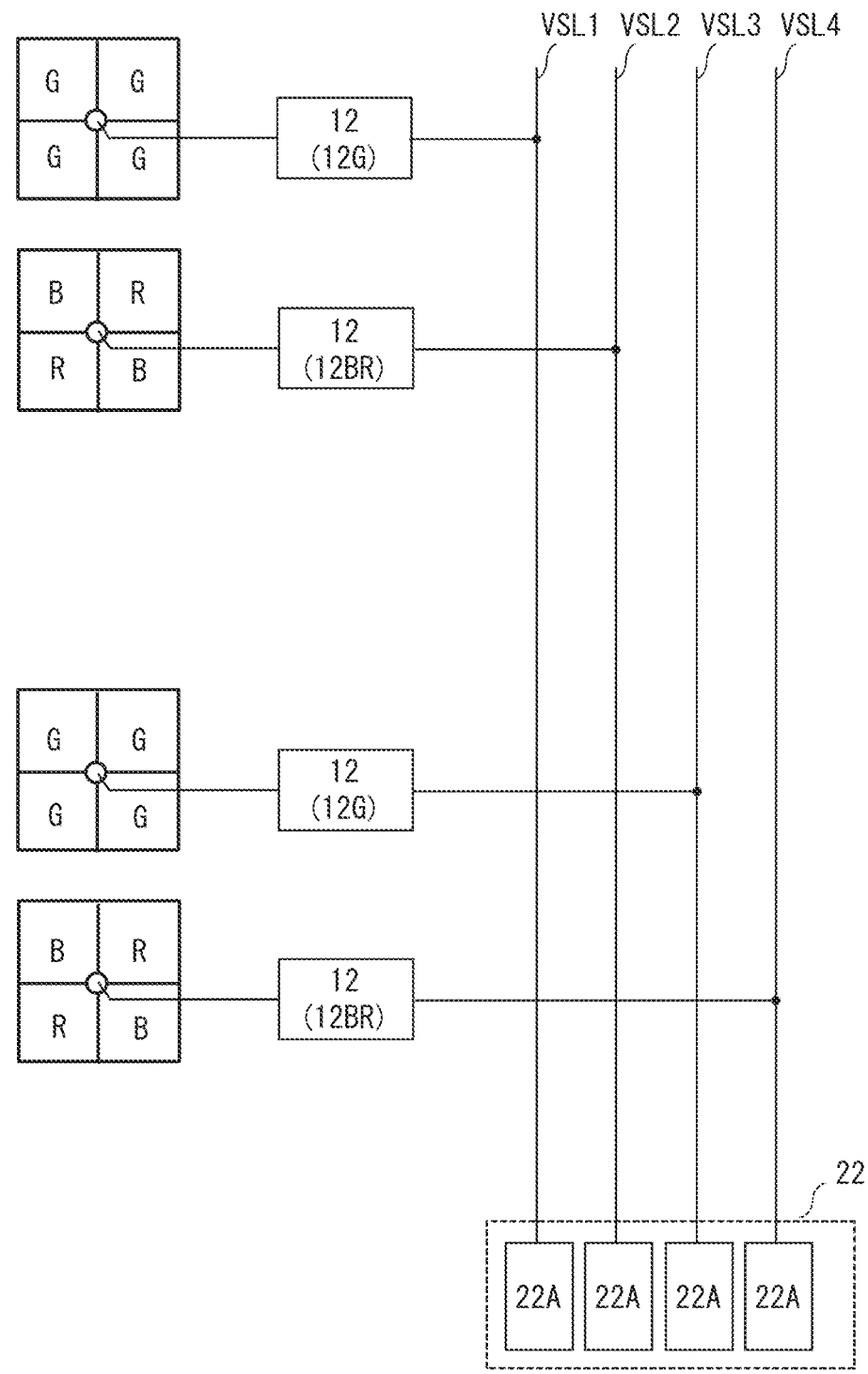
FIG. 31 is a diagram illustrating a modification example of the circuit configuration in FIG. 29.
Figures 32, 33:
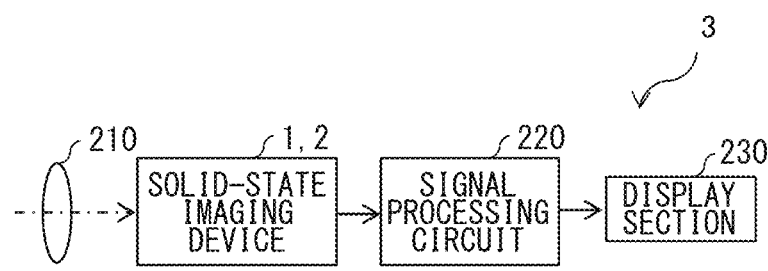
FIG. 32 is a diagram illustrating an example of data output in the solid-state imaging device having the circuit configuration in FIG. 31.
FIG. 33 is a diagram illustrating an example of a schematic configuration of an imaging system including the imaging device according to each of the above-described embodiments and modification examples thereof.

In the above-described second embodiment, for example, as illustrated in FIG. 31, the four data output lines VSL (i.e., twice as many data output lines VSL as stacked layers) may be provided to the solid-state imaging device 2 in each of unit pixel columns. In such a case, for example, as illustrated in FIG. 32, it is possible to increase pixel rows that are simultaneously readable. This allows data to be read out at high speed.

5. Application Example

FIG. 33 illustrates an example of a schematic configuration of an imaging system 3 including the solid-state imaging device 1 according to each of the above-described embodiments and modification examples thereof. The imaging system 3 includes, for example, an optical system 210, the solid-state imaging device 1, a signal processing circuit 220, and a display section 230.

The optical system 210 forms an image of image light (incident light) from a subject on the imaging surface of the solid-state imaging device 1. The solid-state imaging device 1 receives image light (incident light) coming from the solid-state imaging device 1 and outputs a pixel signal corresponding to the received image light (incident light) to the signal processing circuit 220. The signal processing circuit 220 processes the image signal inputted from the solid-state imaging device 1 to generate image data. The signal processing circuit 220 further generates an image signal corresponding to the generated image data and outputs the image signal to the display section 230. The display section 230 displays an image based on the image signal inputted from the signal processing circuit 220.

In the present application example, the solid-state imaging devices 1 according to the above-described embodiments and modification examples thereof are each applied to the imaging system 3. This makes it possible to decrease the solid-state imaging device 1 in size or increase the solid-state imaging device 1 in definition, which makes it possible to provide the imaging system 3 having a small size or high definition.

6. Practical Application Examples

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 34:
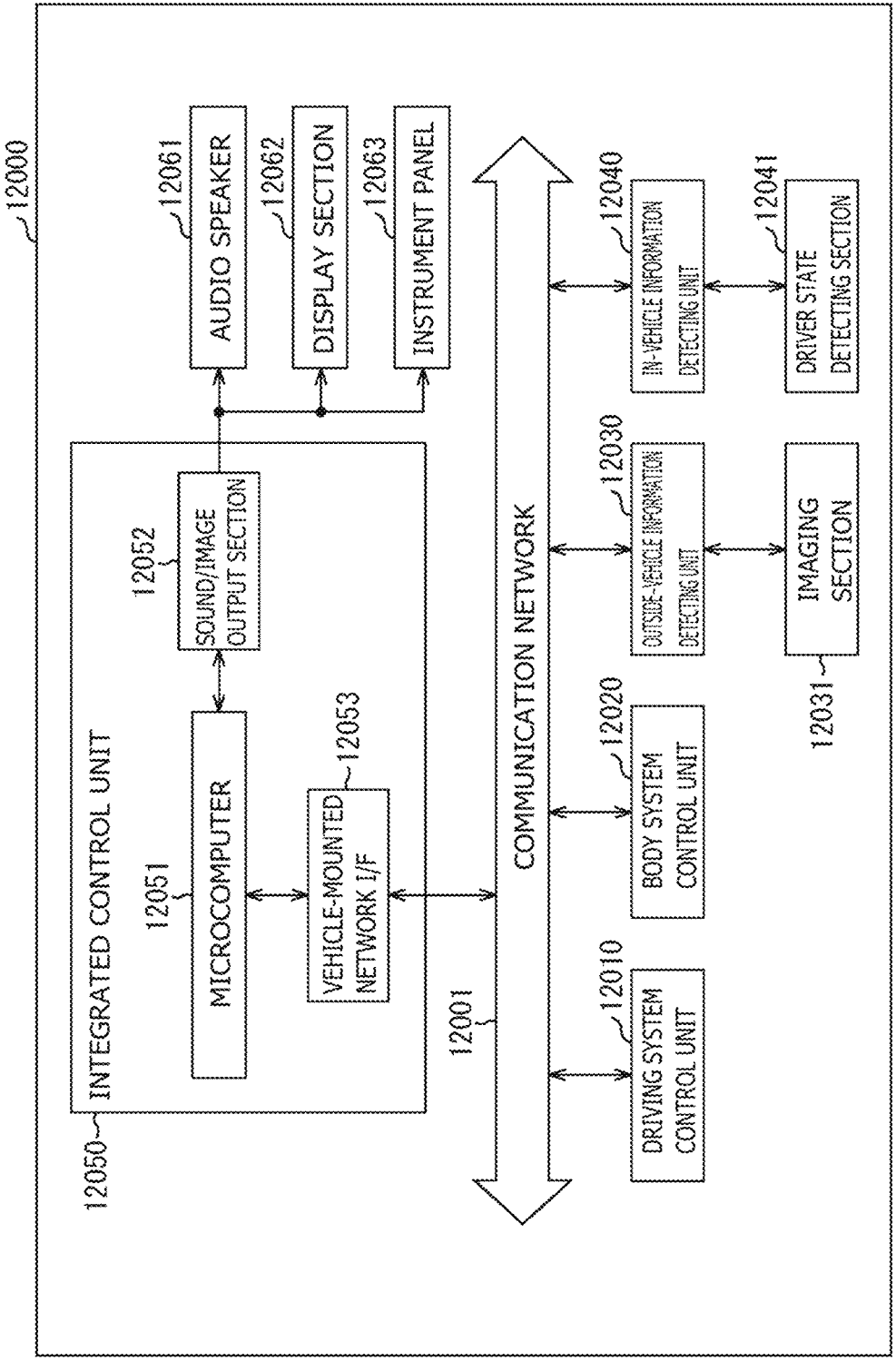
FIG. 34 is a block diagram depicting an example of schematic configuration of a vehicle control system.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

Figure 35:
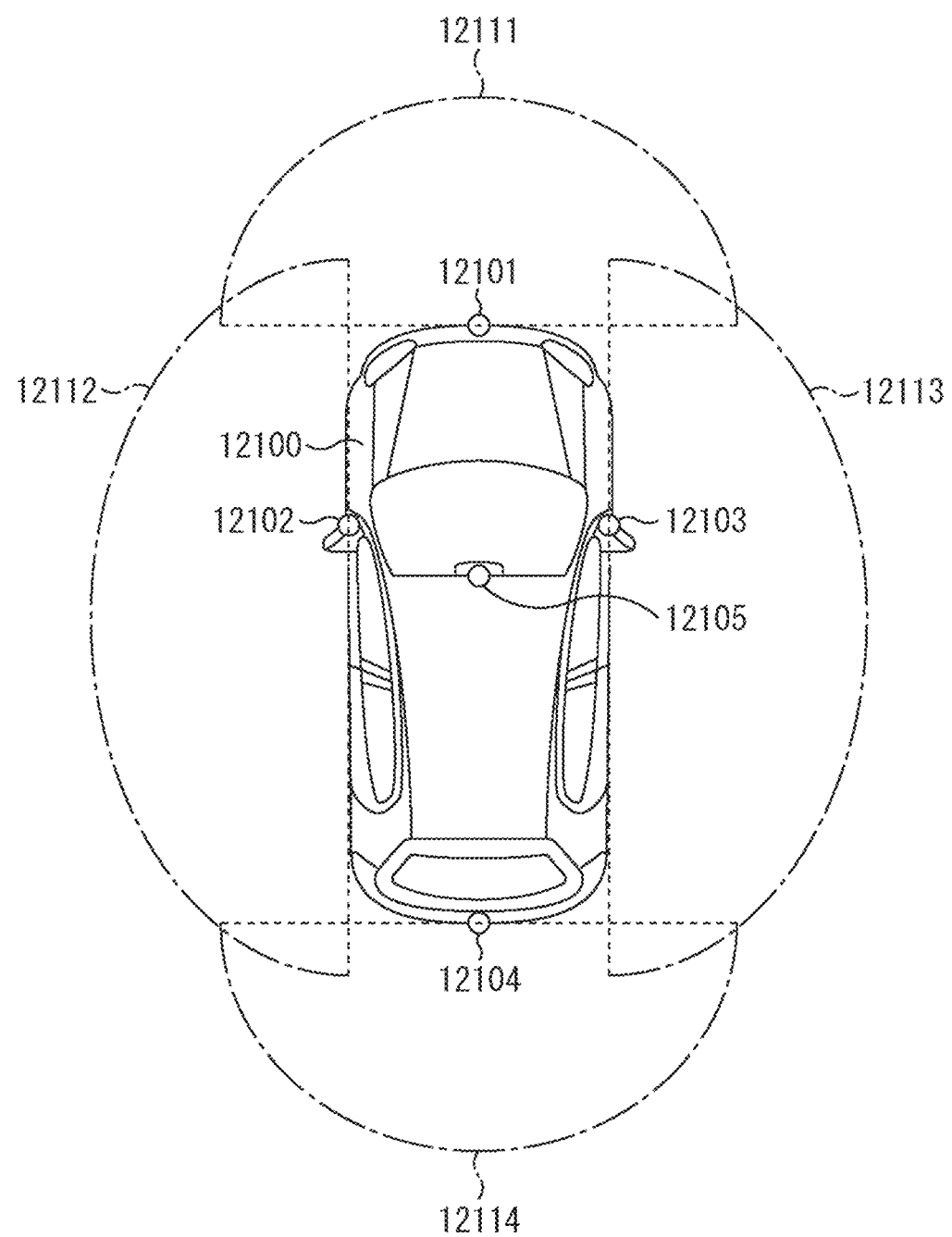
FIG. 35 is a diagram of assistance in explaining an example of installation positions of an outside-vehicle information detecting section and an imaging section.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure may be applied. The technology according to the present disclosure may be applied to the imaging section 12031 among the above-described components. Specifically, the solid-state imaging device 1 according to the above-described embodiments and modification examples thereof are each applicable to the imaging section 12031. The application of the technology according to the present disclosure to the imaging section 12031 makes it possible to obtain a high-definition shot image with less noise and it is thus possible to perform highly accurate control using the shot image in the mobile body control system.

Practical Application Example 2

FIG. 36 is a view depicting an example of a schematic configuration of an endoscopic surgery system to which the technology according to an embodiment of the present disclosure (present technology) can be applied.

In FIG. 36, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 37 is a block diagram depicting an example of a functional configuration of the camera head 11102 and the CCU 11201 depicted in FIG. 36.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be favorably applied to the image pickup unit 11402 provided to the camera head 11102 of the endoscope 11100 among the above-described components. The application of the technology according to the present disclosure to the image pickup unit 11402 makes it possible to obtain a high-definition shot image with less noise and it is thus possible to provide the endoscope 11100 with high image quality.

Although the present disclosure has been described above with reference to the embodiments, the modification examples thereof, the application example thereof, and the practical application examples thereof, the present disclosure is not limited to the above-described embodiments and the like, but may be modified in a variety of ways. It is to be noted that the effects described herein are merely illustrative. The effects of the present disclosure are not limited to the effects described herein. The present disclosure may have effects other than the effects described herein.

In addition, the present disclosure may also have the following configurations.

(1)

A solid-state imaging device including:
  a stacked photoelectric converter for each of pixels, the stacked photoelectric converter having a plurality of photoelectric conversion elements stacked therein, the plurality of photoelectric conversion elements each having different wavelength selectivity; and
  a plurality of data output lines from which pixel signals are outputted, the pixel signals being based on electric charges outputted from the photoelectric conversion elements, in which
  a plurality of the data output lines is provided for each predetermined unit pixel column, the plurality of the data output lines being equal in number to an integer multiple of the photoelectric conversion elements stacked in the stacked photoelectric converter.

(2)

The solid-state imaging device according to (1), further including a pixel circuit for a plurality of the photoelectric conversion elements having same wavelength selectivity, the pixel circuit outputting the pixel signals to the data output lines, the pixel signals being based on the electric charges outputted from the photoelectric conversion elements, in which
  a plurality of the respective data output lines is provided for wavelength selectivity types of the photoelectric conversion elements in each of the unit pixel columns or a plurality of the data output lines is provided for each of wavelength selectivity types of the photoelectric conversion elements in each of the unit pixel columns.

(3)

The solid-state imaging device according to (1), further including a pixel circuit for each of the photoelectric conversion elements, the pixel circuit outputting the pixel signal to the data output line, the pixel signal being based on the electric charge outputted from the photoelectric conversion element, in which
  a plurality of the respective data output lines is provided for wavelength selectivity types of the photoelectric conversion elements in each of the unit pixel columns or a plurality of the data output lines is provided for each of wavelength selectivity types of the photoelectric conversion elements in each of the unit pixel columns.

(4)
The solid-state imaging device according to any one of (1) to (3), further including a column processing circuit for each of the data output lines.

(5)
The solid-state imaging device according to any one of (1) to (4), further including a changeover switch that switches coupling between any of two of a plurality of the data output lines and the column processing circuit.

(6)
The solid-state imaging device according to any one of (1) to (3), in which each of the stacked photoelectric converters includes a color filter.

(7)
The solid-state imaging device according to any one of (1) to (6), in which at least one element among a plurality of the photoelectric conversion elements includes a photoelectric conversion layer in each of the stacked photoelectric converters, the photoelectric conversion layer being formed by using an organic material.

(8)
A solid-state imaging device including:
  a stacked photoelectric converter for each of pixels, the stacked photoelectric converter having a plurality of photoelectric conversion elements stacked therein, the plurality of photoelectric conversion elements each having different wavelength selectivity; and
  a first pixel circuit for each of groups, the first pixel circuit outputting a pixel signal based on an electric charge outputted from a first photoelectric conversion element of a plurality of the photoelectric conversion elements, the first photoelectric conversion element having predetermined wavelength selectivity, the groups being obtained by dividing a plurality of the first photoelectric conversion elements into the plurality of groups, the plurality of the first photoelectric conversion elements being included in a plurality of the photoelectric conversion elements, in which
  the solid-state imaging device further includes a plurality of drive wiring lines to which control signals are applied, the control signals being for controlling output of electric charges accumulated in the photoelectric conversion elements, and
  in a case where a plurality of the first photoelectric conversion elements belonging to a first group and a plurality of the first photoelectric conversion elements belonging to a second group are brought into focus, each of the drive wiring lines is coupled to the first photoelectric conversion elements belonging to the first group and the first photoelectric conversion elements belonging to the second group in each of unit pixel columns corresponding to the shared first pixel circuits, the plurality of the first photoelectric conversion elements belonging to the first group and the plurality of the first photoelectric conversion elements belonging to the second group sharing the different first pixel circuits.

(9)
The solid-state imaging device according to (8), further including two data output lines from which the pixel signals are outputted for each of the unit pixel columns, in which
  one of the data output lines is coupled to the first pixel circuit corresponding to the first group and another of the data output lines is coupled to the first pixel circuit corresponding to the second group in each of the unit pixel columns.

(10)
The solid-state imaging device according to (9), in which the first photoelectric conversion elements belonging to the first group and the first photoelectric conversion elements belonging to the second group to which each of the drive wiring lines is coupled are alternately disposed in a direction parallel with the unit pixel column.

(11)
The solid-state imaging device according to (9) or (10), further including a second pixel circuit for each of groups, the second pixel circuit outputting a pixel signal based on an electric charge outputted from a second photoelectric conversion element of a plurality of the photoelectric conversion elements other than the first photoelectric conversion element, the groups being obtained by dividing a plurality of the second photoelectric conversion elements into the plurality of groups, the plurality of the second photoelectric conversion elements being included in a plurality of the photoelectric conversion elements, in which
  in a case where a plurality of the second photoelectric conversion elements belonging to a third group and a plurality of the second photoelectric conversion elements belonging to a fourth group are brought into focus, one of the data output lines is coupled to each of the second photoelectric conversion elements belonging to the third group and another of the data output lines is coupled to each of the second photoelectric conversion elements belonging to the fourth group in each of unit pixel columns corresponding to the shared first pixel circuits, the plurality of the second photoelectric conversion elements belonging to the third group and the plurality of the second photoelectric conversion elements belonging to the fourth group sharing the different second pixel circuits.

(12)
The solid-state imaging device according to (11), in which a plurality of the second photoelectric conversion elements includes a plurality of the photoelectric conversion elements in each of the third group and the fourth group, the plurality of the photoelectric conversion elements each having different wavelength selectivity.

(13)
The solid-state imaging device according to any one of (8) to (12), in which at least one element among a plurality of the photoelectric conversion elements includes a photoelectric conversion layer in each of the stacked photoelectric converters, the photoelectric conversion layer being formed by using an organic material.

(14)
A solid-state imaging device including:
  a stacked photoelectric converter for each of pixels, the stacked photoelectric converter having a plurality of photoelectric conversion elements stacked therein, the plurality of photoelectric conversion elements each having different wavelength selectivity;
  a first pixel circuit for each of first photoelectric conversion elements of a plurality of the photoelectric conversion elements, the first photoelectric conversion elements having predetermined wavelength selectivity, the first pixel circuit outputting a pixel signal based on an electric charge outputted from the first photoelectric conversion element; and a second pixel circuit for each of groups, the second pixel circuit outputting a pixel signal based on an electric charge outputted from a second photoelectric conversion element of a plurality of the photoelectric conversion elements other than the first photoelectric conversion element, the groups being obtained by dividing a plurality of the second photoelectric conversion elements into the plurality of groups, the plurality of the second photoelectric conversion elements being included in a plurality of the photoelectric conversion elements, in which the solid-state imaging device further includes two data output lines from which the pixel signals are outputted for each of pixel columns, one of the data output lines is coupled to each of the first pixel circuits and another of the data output lines is coupled to each of the second pixel circuits in each of the pixel columns, and each of the first photoelectric conversion elements includes two photoelectric conversion sections.

(15)

The solid-state imaging device according to (14), further including two drive wiring lines to which control signals are applied for each of the pixel columns, the control signals being for controlling output of electric charges accumulated in the photoelectric conversion sections, in which one of the drive wiring lines is coupled to one of the photoelectric conversion sections and another of the drive wiring lines is coupled to another of the photoelectric conversion sections in each of pixel rows.

(16)

The solid-state imaging device according to (14) or (15), in which at least one element among a plurality of the photoelectric conversion elements includes a photoelectric conversion layer in each of the stacked photoelectric converters, the photoelectric conversion layer being formed by using an organic material.

The solid-state imaging device according to the first embodiment of the present disclosure is provided with a plurality of data output lines for each predetermined unit pixel column. The plurality of data output lines is equal in number to an integer multiple of photoelectric conversion elements stacked in a stacked photoelectric converter. This makes it possible to achieve a solid-state imaging device that has a pixel and a data output line appropriately coupled from the perspective of high-speed data readout.

The solid-state imaging device according to the second embodiment of the present disclosure couples the respective drive wiring lines to the first photoelectric conversion elements belonging to the first group and the first photoelectric conversion elements belonging to the second group in each of unit pixel columns. This makes it possible to achieve a solid-state imaging device that has a pixel and a drive wiring line appropriately coupled from the perspective of an aperture ratio.

The solid-state imaging device according to the third embodiment of the present disclosure makes it possible to achieve a solid-state imaging device that has a pixel and a data output line appropriately coupled from the perspective of data readout efficiency.

It is to be noted that the effects of the present technology are not necessarily limited to the effects described here, but may include any of the effects described herein.

This application claims the priority on the basis of Japanese Patent Application No. 2018-144065 filed on Jul. 31, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:
   a plurality of pixels;
   a plurality of stacked photoelectric converters, wherein one stacked photoelectric converter of the plurality of stacked photoelectric converters is included in each pixel of the plurality of pixels, each of the stacked photoelectric converters having a plurality of photoelectric conversion elements stacked therein, the plurality of photoelectric conversion elements each having different wavelength selectivity; and
   a plurality of data output lines from which pixel signals are outputted, the pixel signals being based on electric charges outputted from the photoelectric conversion elements,
   wherein a number of the data output lines is provided for each of a plurality of predetermined unit pixel columns,
   wherein the number of the data output lines provided for each of the plurality of predetermined unit pixel columns is equal to an integer multiple of the photoelectric conversion elements stacked in each of the stacked photoelectric converter,
   wherein a first stacked photoelectric converter of the plurality of photoelectric converters includes a first photoelectric conversion element, a second photoelectric conversion element, and a first color filter provided between the first photoelectric conversion element and the second photoelectric conversion element,
   wherein a second stacked photoelectric converter of the plurality of photoelectric converters includes a third photoelectric conversion element, a fourth photoelectric conversion element, and a second color filter provided between the third photoelectric conversion element and the fourth photoelectric conversion element,
   wherein the first photoelectric conversion element and the third photoelectric conversion element are configured to selectively perform photoelectric conversion of light of a first color,
   wherein the second photoelectric conversion element is configured to perform photoelectric conversion of light of a second color that has transmitted through the first photoelectric conversion element and the first color filter,
   wherein the fourth photoelectric conversion element is configured to perform photoelectric conversion of light of a third color that has transmitted through the third photoelectric conversion element and the second color filter,
   wherein a first data output line is provided for the first photoelectric conversion element and the third photoelectric conversion element, and
   wherein a second data output line is provided for the second photoelectric conversion element and the fourth photoelectric conversion element.

2. The solid-state imaging device according to claim 1, further comprising a pixel circuit for a plurality of the photoelectric conversion elements having a same wavelength selectivity, the pixel circuit outputting the pixel signals to the data output lines, the pixel signals being based on the electric charges outputted from the photoelectric conversion elements, wherein
    a plurality of the respective data output lines is provided for wavelength selectivity types of the photoelectric conversion elements in each of the unit pixel columns or a plurality of the data output lines is provided for each of wavelength selectivity types of the photoelectric conversion elements in each of the unit pixel columns.

3. The solid-state imaging device according to claim 1, further comprising a pixel circuit for each of the photoelectric conversion elements, the pixel circuit outputting the pixel signal to the data output line, the pixel signal being based on the electric charge outputted from the photoelectric conversion element, wherein
    a plurality of the respective data output lines is provided for wavelength selectivity types of the photoelectric conversion elements in each of the unit pixel columns or a plurality of the data output lines is provided for each of wavelength selectivity types of the photoelectric conversion elements in each of the unit pixel columns.

4. The solid-state imaging device according to claim 1, further comprising a column processing circuit for each of the data output lines.

5. The solid-state imaging device according to claim 1, further comprising a changeover switch that switches coupling between any of two of a plurality of the data output lines and a column processing circuit.

6. The solid-state imaging device according to claim 1, wherein at least one element among a plurality of the photoelectric conversion elements includes a photoelectric conversion layer in each of the stacked photoelectric converters, the photoelectric conversion layer being formed by using an organic material.

\* \* \* \* \*